(12) United States Patent
Rinaldi et al.

(10) Patent No.: US 11,258,423 B2
(45) Date of Patent: Feb. 22, 2022

(54) ALUMINUM NITRIDE COMBINED OVERTONE RESONATORS FOR THE MMWAVE SPECTRUM

(71) Applicant: Northeastern University, Boston, MA (US)

(72) Inventors: Matteo Rinaldi, Boston, MA (US); Guofeng Chen, Fremont, CA (US)

(73) Assignee: Northeastern University, Boston, MA (US)

(*) Notice: Subject to any disclaimer, the term of this patent is extended or adjusted under 35 U.S.C. 154(b) by 0 days.

(21) Appl. No.: 17/069,331

(22) Filed: Oct. 13, 2020

(65) Prior Publication Data

US 2021/0111696 A1    Apr. 15, 2021

Related U.S. Application Data

(60) Provisional application No. 62/913,848, filed on Oct. 11, 2019.

(51) Int. Cl.
*H03H 9/02* (2006.01)
*H03H 9/64* (2006.01)
*H03H 9/46* (2006.01)

(52) U.S. Cl.
CPC .... *H03H 9/02228* (2013.01); *H03H 9/02338* (2013.01); *H03H 9/462* (2013.01); *H03H 2009/02527* (2013.01)

(58) Field of Classification Search
CPC ............... H03H 9/02228; H03H 9/462; H03H 9/02338; H03H 2009/02527; H03H 9/02244

USPC ................... 333/133, 186, 187, 188
See application file for complete search history.

(56) References Cited

U.S. PATENT DOCUMENTS

| | | | |
|---|---|---|---|
| 9,419,583 B2 | 8/2016 | Rinaldi et al. | |
| 9,425,765 B2 | 8/2016 | Rinaldi et al. | |
| 9,705,469 B2 | 7/2017 | Rinaldi et al. | |
| 9,712,136 B2 | 7/2017 | Rinaldi et al. | |
| 2015/0162520 A1* | 6/2015 | Gong | H01L 41/1873 310/363 |

OTHER PUBLICATIONS

Hara, M. et al., "Super-High-Frequency Band Filters Configured with Air-Gap-Type Thin-Film Bulk Acoustic Resonators," Jpn. J. Appl. Phys., vol. 49, No. 7, 07HD13, pp. 1-5, 2010.
Yoshino, Y., "Piezoelectric thin films and their applications for electronics," J. Appl. Phys., vol. 105, No. 6, 061623, pp. 1-8, 2009.
(Continued)

*Primary Examiner* — Robert J Pascal
*Assistant Examiner* — Jorge L Salazar, Jr.
(74) *Attorney, Agent, or Firm* — Verrill Dana, LLP

(57) ABSTRACT

A resonator system is provided in which a combined overtone resonator device is excited with a two-dimensional mode of mechanical vibration in a cross sectional plane of a piezoelectric plate in response to an alternating voltage applied through an interdigitated electrode. The cross sectional plane extends along the width direction and the thickness direction, and the two-dimensional mode of mechanical vibration is a two-dimensional combined overtone mode of second and third order asymmetrical Lambwave overtones.

20 Claims, 14 Drawing Sheets

(56) References Cited

OTHER PUBLICATIONS

Yang, Y. et al., "Toward Ka Band Acoustics: Lithium Niobate Asymmetrical Mode Piezoelectric MEMS Resonators," in 2018 IEEE International Frequency Control Symposium (IFCS), Olympic Valley, CA, 2018, pp. 1-5.

Yokoyama, T. et al., "K-Band Ladder Filters Employing Air-Gap Type Thin Film Bulk Acoustic Resonators," in 2008 IEEE Ultrasonics Symposium, Beijing, China, 2008, pp. 598-601.

Iborra, E. et al., "Optimization of thin AlN sputtered films for X-band BAW resonators," in 2010 IEEE International Ultrasonics Symposium, San Diego, CA, USA, 2010, pp. 1688-1691.

Iborra, E. et al., "Low-thickness high-quality aluminum nitride films for super high frequency solidly mounted resonators", Thin Solid Films, vol. 520, No. 7, pp. 3060-3063, 2012.

Chen, G et al., "High-Q X Band Aluminum Nitride Combined Overtone Resonators," in 2019 Joint Conference of the IEEE International Frequency Control Symposium & European Frequency and Time Forum (IFCS-EFTF 2019), Orlando, FL, 2019, pp. 1-3.

Cassella, C. et al., "Aluminum Nitride Cross-Sectional Lame Mode Resonators," J. Microelectromechanical Syst., vol. 25, No. 2, pp. 275-285, Apr. 2016.

Chen, G. et al., "Lithographically defined aluminum nitride cross-sectional Lame mode resonators," J. Micromechanics Microengineering, vol. 27, No. 3, p. 034003, pp. 1-7, 2017.

\* cited by examiner d) COR Stress Field a) $\varepsilon_y$ under 35 U.S.C. § 119(e)

ALUMINUM NITRIDE COMBINED OVERTONE RESONATORS FOR THE MMWAVE SPECTRUM

CROSS REFERENCE TO RELATED APPLICATIONS

This application claims priority under 35 U.S.C. § 119(e) of U.S. Provisional Application No. 62/913,848, filed on 11 Oct. 2019, entitled "Aluminum Nitride Combined Overtone Resonators for the mmWave Spectrum," the disclosure of which is hereby incorporated by reference.

STATEMENT REGARDING FEDERALLY SPONSORED RESEARCH OR DEVELOPMENT

This invention was made with government support under Grant No. HR0011-17-2-0002 awarded by DARPA. The government has certain rights in the invention.

BACKGROUND

Microelectromechanical (MEM) resonators are enablers for the development of miniaturized and low-power multiband radiofrequency (RF) systems capable of operating in the crowded modern commercial and military spectral environment.

SUMMARY

An acoustic microelectromechanical system (MEMS) combined overtone resonator (COR) is provided. The COR is capable of addressing the filter requirements for the 5G mmWave spectrum in the 6-40 GHz range. The COR exploits the multimodal excitation of two higher-order Lamb waves ($2^{nd}$ and $3^{rd}$ order Asymmetrical Lamb Waves) in a suspended thin-film piezoelectric (e.g., aluminum nitride) plate to transduce a 2-dimensional vibration mode with high electromechanical coupling coefficient $k_t^2$ and quality factor Q. In some cases, the electromechanical coupling coefficient $k_t^2$ can be up to 1.9% and quality factor Q can be greater than 1100 at twice the frequency of a fundamental thickness-extensional mode in the same structure.

Analytical and finite-element method (FEM) models were developed to describe the working principle of the COR technology and predict the achievable $k_t^2$, Q and lithographic frequency tunability. An 8.8 GHz COR prototype was fabricated showing a high $k_t^2 \sim 0.3\%$ (using a simple top-electrode-only configuration with a 2-mask process) and a Q~1100 which is the highest ever achieved among piezoelectric resonators above 6 GHz. The f-Q product~$1 \times 10^{13}$ is the highest among all demonstrated piezoelectric resonators with metallic coverage >50%. Additionally, the capability of the COR technology to deliver contiguous filters with bandwidths between 355 and 592 MHz (aggregated BW>2 GHz) in the mmWave spectrum, with relaxed lithographic requirements, was demonstrated by FEM.

The technology includes the following:
1. A resonator system comprising:
   a combined overtone resonator device comprising:
   a piezoelectric plate suspended from a substrate, the piezoelectric plate having a top surface, a bottom surface, a length direction, a width direction and a thickness direction between the top surface and the bottom surface, the top surface and the bottom surface extending along the length direction and the width direction, and
   a first interdigitated electrode comprising a plurality of conductive strips disposed on one of the top surface or the bottom surface of the piezoelectric plate, wherein each conductive strip has an electrode width substantially along the width direction, and wherein the plurality of conductive strips are arranged with a pitch substantially along the width direction; and
   circuitry in communication with the combined overtone resonator device to apply an alternating voltage through the first interdigitated electrode to excite a two-dimensional mode of mechanical vibration in a cross sectional plane of the piezoelectric plate, the cross sectional plane extending along the width direction and the thickness direction, the two-dimensional mode of mechanical vibration comprising a two-dimensional combined overtone mode of second and third order asymmetrical Lamb-wave overtones.

2. The system of 1, wherein adjacent ones of the conductive strips have opposite polarities.

3. The system of 1-2, further comprising a second interdigitated electrode including a plurality of conductive strips disposed on another of the top surface or the bottom surface of the piezoelectric plate; and
   the circuitry is in communication with the device to apply the alternating voltage through the first interdigitated electrode and the second interdigitated electrode to excite the two-dimensional mode of mechanical vibration in the cross sectional plane.

4. The system of any of 3, wherein adjacent ones of the conductive strips on the top surface have opposite polarities, and ones of the conductive strips on the bottom surface have a same polarity as a most closely overlying one of the conductive strips on the top surface.

5. The system of any of 1-4, further comprising a second plate electrode disposed on another of the top surface or the bottom surface of the piezoelectric plate.

6. The system of any of 1-5, wherein the second plate electrode covers a portion of the area of the top surface or the bottom surface of the piezoelectric plate, wherein the portion is 10%, 20%, 30%, 40%, 50%, 60%, 70%, 80%, 90%, or 100% of the area.

7. The system of 1-6, wherein the pitch of the first interdigitated electrode is equal to the thickness of the piezoelectric plate.

8. The system of any of 1-7, wherein the pitch of the first interdigitated electrode is approximately equal to the thickness of the piezoelectric plate within a tolerance of ±0.1%, ±0.2%, ±0.5%, or ±1.0%.

9. The system of any of 1-8, wherein the pitch of the first interdigitated electrode is within 50%, within 40%, within 30%, within 20%, within 10%, within 5%, within 2%, within 1%, or within 0.5% of the thickness of the piezoelectric plate.

10. The system of any of 1-9, wherein the pitch of the first interdigitated electrode is in a range of 50 nm to 100 µm.

11. The system of any of 1-10, wherein the pitch of the first interdigitated electrode is in a range of about 50 nm to about 100 µm, within a tolerance of ±0.1%, ±0.2%, ±0.5%, or ±1.0%.

12. The system of any of 1-11, wherein a ratio of the pitch of the first interdigitated electrode to the thickness of the piezoelectric plate is selected to maintain an electro-mechanical coupling efficiency of at least 50% of a electromechanical coupling efficiency when the pitch of the first interdigitated electrode is equal to or approximately equal to the thickness of the piezoelectric plate.

13. The system of any of 1-12, wherein the first interdigitated electrode covers at least 10%, 20%, 25%, 30%, 40%, 50%, 60%, 70%, 75%, 80%, or 90% of the area of the top surface or the bottom surface.

14. The system of any of 1-13, wherein the first interdigitated electrode covers at least 35% of the area of the top surface or the bottom surface.

15. The system of any of 1-14, wherein the electrode width of each conductive strip is in a range of 10 nm to 10 μm.

16. The system of any of 1-15, wherein the electrode width of each conductive strip is in a range of about 10 nm to about 10 μm, within a tolerance of ±0.1%, ±0.2%, ±0.5%, or ±1.0%.

17. The system of any of 1-16, wherein an electrode thickness of each conductive strip ranges from 5% to 100% of the thickness of the piezoelectric plate.

18. The system of any of 1-17, wherein an electrode thickness of each conductive strip is 10% of the thickness of the piezoelectric plate.

19. The system of any of 1-18, wherein an electrode thickness of each conductive strip is about 10% of the thickness of the piezoelectric plate, within a tolerance of ±0.1%, ±0.2%, ±0.5%, or ±1.0%.

20. The system of any of 1-19, wherein the thickness of the piezoelectric plate is in a range of 100 nm to 100 μm or of 220 nm to 10 μm.

21. The system of any of 1-20, wherein the thickness of the piezoelectric plate is at least 220 nm.

22. The system of any of 1-21, wherein the piezoelectric plate is a piezoelectric material.

23. The system of any of 1-22, wherein the piezoelectric plate is selected from aluminum nitride, lithium niobate, lithium tantalite, zinc oxide, gallium nitride, scandium nitride, aluminum scandium nitride, and quartz, and combinations thereof.

24. The system of any of 1-23, wherein the piezoelectric plate comprises a combined coherent combination of $e_{33}$ and $e_{15}$ piezoelectric coefficients for multimodal excitation of the second and third order asymmetrical Lamb-wave overtones.

25. The system of any of 1-24, wherein the first interdigitated electrode is a conductive material.

26. The system of any of 1-25, wherein the first interdigitated electrode is a metal material.

27. The system of any of 1-26, wherein the first interdigitated electrode is selected from aluminum, ruthenium, molybdenum, and tungsten and combinations thereof.

28. The system of any of 1-27, wherein a frequency of the two-dimensional combined overtone mode is in a range of about 1 MHz to about 100 GHz, within a tolerance of ±0.1%, ±0.2%, ±0.5%, or ±1.0%.

29. The system of any of 1-28, wherein a frequency of the two-dimensional combined overtone mode is in a range of 1 MHz to 100 GHz.

30. The system of any of 1-29, wherein the device has an electro-mechanical coupling efficiency of 0.1% to 10.0%.

31. The system of any of 1-30, wherein the device has an electro-mechanical coupling efficiency of at least 0.1%, at least 0.2%, at least 0.3%, at least 0.4%, at least 0.5%, at least 0.6%, at least 0.7%, at least 0.8%, at least 0.9%, at least 1.0%, at least 1.2%, at least 1.4%, at least 1.6%, at least 1.8%, at least 2.0%, at least 2.5%, at least 3.0%, at least 3.5%, at least 4.0%, at least 4.5%, at least 5.0%, at least 6.0%, at least 7.0%, at least 8.0%, at least 9.0%, or at least 10.0%.

32. The system of any of 1-31, wherein the device has a quality factor of at least 10.

33. The system of any of 1-32, wherein the device has a quality factor of at least 200 or at least 500 or at least 1000 at a frequency of 6 GHz or greater.

34. The system of any of 1-33, wherein the device is operative in a frequency range of 1 MHz to 100 GHz.

35. The system of any of 1-34, wherein the device is operative in a frequency range of 6 GHz to 40 GHz.

36. The system of any of 1-35, wherein the circuitry comprises filter circuitry, circulator circuitry, or oscillator circuitry.

37. A filter comprising a plurality of combined overtone resonator devices of any of 1-36, the devices formed on a single substrate, each device tuned to a different frequency bandwidth.

38. The filter of 37, wherein the pitch of the first interdigitated electrode of each device is different from the pitch of the first interdigitated electrodes of others of the plurality of devices.

39. The filter of any of 37-38, wherein the frequency bandwidth of each device is greater than 1 MHz.

40. The filter of any of 37-39, wherein the frequency bandwidth of each device ranges from 300 to 600 MHz.

41. The filter of any of 37-40, wherein an aggregated frequency bandwidth of the plurality of devices is greater than 1 MHz, greater than 1 GHz, or greater than 1.6 GHz.

42. A filter comprising:
    a plurality of combined overtone resonator devices, the devices formed on a single substrate, each device tuned to a different frequency bandwidth, each device comprising:
        a piezoelectric plate suspended from a substrate, the piezoelectric plate having a top surface, a bottom surface, a length direction, a width direction and a thickness direction between the top surface and the bottom surface, the top surface and the bottom surface extending along the length direction and the width direction, and
        a first interdigitated electrode comprising a plurality of conductive strips disposed on one of the top surface or the bottom surface of the piezoelectric plate, wherein each conductive strip has an electrode width substantially along the width direction, and wherein the plurality of conductive strips are arranged with a pitch substantially along the width direction; and
    circuitry in communication with each of the combined overtone resonator devices to apply an alternating voltage through the first interdigitated electrode to excite a two-dimensional mode of mechanical vibration in a cross sectional plane of the piezoelectric plate, the cross sectional plane extending along the width direction and the thickness direction, the two-dimensional mode of mechanical vibration comprising a two-dimensional combined overtone mode of second and third order asymmetrical Lamb-wave overtones.

43. The filter of 42, wherein, in at least one device, adjacent ones of the conductive strips have opposite polarities.

44. The filter of any of 42-43, further comprising, in a least one device, a second interdigitated electrode including a plurality of conductive strips disposed on another of the top surface or the bottom surface of the piezoelectric plate; and
    the circuitry is in communication with the device to apply the alternating voltage through the first interdigitated electrode and the second interdigitated electrode to excite the two-dimensional mode of mechanical vibration in the cross sectional plane.

45. The filter of any of 44, wherein, in at least one device, adjacent ones of the conductive strips on the top surface have opposite polarities, and ones of the conductive strips on the bottom surface have a same polarity as a most closely overlying one of the conductive strips on the top surface.

46. The filter of any of 42-45, further comprising, in at least one device, a second plate electrode disposed on another of the top surface or the bottom surface of the piezoelectric plate.

47. The filter of any of 42-46, wherein, in at least one device, the second plate electrode covers a portion of the area of the top surface or the bottom surface of the piezoelectric plate, wherein the portion is 10%, 20%, 30%, 40%, 50%, 60%, 70%, 80%, 90%, or 100% of the area.

48. The filter of any of 42-47, wherein, in at least one device, the pitch of the first interdigitated electrode is equal to the thickness of the piezoelectric plate.

49. The filter of any of 42-48, wherein, in at least one device, the pitch of the first interdigitated electrode is approximately equal to the thickness of the piezoelectric plate within a tolerance of ±0.1%, ±0.2%, ±0.5%, or ±1.0%.

50. The filter of any of 42-49, wherein, in at least one device, the pitch of the first interdigitated electrode is within 50%, within 40%, within 30%, within 20%, within 10%, within 5%, within 2%, within 1%, or within 0.5% of the thickness of the piezoelectric plate.

51. The filter of any of 42-50, wherein, in at least one device, the pitch of the first interdigitated electrode is in a range of 50 nm to 100 μm.

52. The filter of any of 42-51, wherein, in at least one device, the pitch of the first interdigitated electrode is in a range of about 50 nm to about 100 μm, within a tolerance of ±0.1%, ±0.2%, ±0.5%, or ±1.0%.

53. The filter of any of 42-52, wherein, in at least one device, a ratio of the pitch of the first interdigitated electrode to the thickness of the piezoelectric plate is selected to maintain an electro-mechanical coupling efficiency of at least 50% of a electro-mechanical coupling efficiency when the pitch of the first interdigitated electrode is equal to or approximately equal to the thickness of the piezoelectric plate.

54. The filter of any of 42-53, wherein, in at least one device, the first interdigitated electrode covers at least 10%, 20%, 25%, 30%, 40%, 50%, 60%, 70%, 75%, 80%, or 90% of the area of the top surface or the bottom surface.

55. The filter of any of 42-54, wherein, in at least one device, the first interdigitated electrode covers at least 35% of the area of the top surface or the bottom surface.

56. The filter of any of 42-55, wherein, in at least one device, the electrode width of each conductive strip is in a range of 10 nm to 10 μm.

57. The filter of any of 42-56, wherein, in at least one device, the electrode width of each conductive strip is in a range of about 10 nm to about 10 μm, within a tolerance of ±0.1%, ±0.2%, ±0.5%, or ±1.0%.

58. The filter of any of 42-57, wherein, in at least one device, an electrode thickness of each conductive strip ranges from 5% to 100% of the thickness of the piezoelectric plate.

59. The filter of any of 42-58, wherein, in at least one device, an electrode thickness of each conductive strip is 10% of the thickness of the piezoelectric plate.

60. The filter of any of 42-59, wherein, in at least one device, an electrode thickness of each conductive strip is about 10% of the thickness of the piezoelectric plate, within a tolerance of ±±0.1%, ±0.2%, 0.5%, or ±1.0%.

61. The filter of any of 42-60, wherein, in at least one device, the thickness of the piezoelectric plate is in a range of 100 nm to 100 μm or of 220 nm to 10 μm.

62. The filter of any of 42-61, wherein, in at least one device, the thickness of the piezoelectric plate is at least 220 nm.

63. The filter of any of 42-62, wherein, in at least one device, the piezoelectric plate is a piezoelectric material.

64. The filter of any of 42-63, wherein, in at least one device, the piezoelectric plate is selected from aluminum nitride, lithium niobate, lithium tantalite, zinc oxide, gallium nitride, scandium nitride, aluminum scandium nitride, and quartz, and combinations thereof.

65. The filter of any of 42-64, wherein, in at least one device, the piezoelectric plate comprises a combined coherent combination of $e_{33}$ and $e_{15}$ piezoelectric coefficients for multimodal excitation of the second and third order asymmetrical Lamb-wave overtones.

66. The filter of any of 42-65, wherein, in at least one device, the first interdigitated electrode is a conductive material.

67. The filter of any of 42-66, wherein, in at least one device, the first interdigitated electrode is a metal material.

68. The filter of any of 42-67, wherein, in at least one device, the first interdigitated electrode is selected from aluminum, ruthenium, molybdenum, and tungsten and combinations thereof.

69. The filter of any of 42-68, wherein a frequency of the two-dimensional combined overtone mode is in a range of about 1 MHz to about 100 GHz, within a tolerance of ±0.1%, ±0.2%, ±0.5%, or ±1.0%.

70. The filter of any of 42-69, wherein a frequency of the two-dimensional combined overtone mode is in a range of 1 MHz to 100 GHz.

71. The filter of any of 42-70, wherein, in at least one device, the device has an electro-mechanical coupling efficiency of 0.1% to 10.0%.

72. The filter of any of 42-71, wherein, in at least one device, the device has an electro-mechanical coupling efficiency of at least 0.1%, at least 0.2%, at least 0.3%, at least 0.4%, at least 0.5%, at least 0.6%, at least 0.7%, at least 0.8%, at least 0.9%, at least 1.0%, at least 1.2%, at least 1.4%, at least 1.6%, at least 1.8%, at least 2.0%, at least 2.5%, at least 3.0%, at least 3.5%, at least 4.0%, at least 4.5%, at least 5.0%, at least 6.0%, at least 7.0%, at least 8.0%, at least 9.0%, or at least 10.0%.

73. The filter of any of 42-72, wherein, in at least one device, the device has a quality factor of at least 10.

74. The filter of any of 42-73, wherein, in at least one device, the device has a quality factor of at least 200 or at least 500 or at least 1000 at a frequency of 6 GHz or greater.

75. The filter of any of 42-74, wherein, in at least one device, the device is operative in a frequency range of 1 MHz to 100 GHz.

76. The filter of any of 42-75, wherein, in at least one device, the device is operative in a frequency range of 6 GHz to 40 GHz.

77. The filter of any of 42-76, wherein the pitch of the first interdigitated electrode of each device is different from the pitch of the first interdigitated electrodes of others of the plurality of devices.

78. The filter of any of 42-77, wherein the frequency bandwidth of each device is greater than 1 MHz.

79. The filter of any of 42-78, wherein the frequency bandwidth of each device ranges from 300 to 600 MHz.

80. The filter of any of 42-79, wherein an aggregated frequency bandwidth of the plurality of devices is greater than 1 MHz, greater than 1 GHz, or greater than 1.6 GHz.

81. A combined overtone resonator device comprising:
a piezoelectric plate suspended from a substrate, the piezoelectric plate having a top surface, a bottom surface, a length direction, a width direction, and a thickness direction between the top surface and the bottom surface, the top surface and the bottom surface extending along the length direction and the width direction; and a first interdigitated electrode comprising a plurality of conductive strips disposed on the top surface of the piezoelectric plate, a second interdigitated electrode comprising a plurality of conductive strips disposed on the bottom surface of the piezoelectric plate, wherein each of the conductive strips has an electrode width substantially along the width direction, and wherein the plurality of conductive strips are arranged with a pitch substantially along the width direction;

adjacent ones of the conductive strips on the top surface have opposite polarities, and each of the conductive strips on the bottom surface has a same polarity as a most closely overlying one of the conductive strips on the top surface; and wherein a two-dimensional mode of mechanical vibration is excited in a cross sectional plane of the piezoelectric plate in response to an alternating voltage applied through the interdigitated electrode and the second interdigitated electrode, the cross sectional plane extending along the width direction and the thickness direction, the two-dimensional mode of mechanical vibration comprising a two-dimensional combined overtone mode of second and third order asymmetrical Lamb-wave overtones.

82. The device of 81, wherein the pitch of the first interdigitated electrode and/or the second electrode is equal to the thickness of the piezoelectric plate.

83. The device of any of 81-82, wherein the pitch of the first interdigitated electrode and/or the second electrode is approximately equal to the thickness of the piezoelectric plate within a tolerance of ±0.1%, ±0.2%, ±0.5%, or ±1.0%.

84. The device of any of 81-83, wherein the pitch of the first interdigitated electrode and/or the second electrode is within 50%, within 40%, within 30%, within 20%, within 10%, within 5%, within 2%, within 1%, or within 0.5% of the thickness of the piezoelectric plate.

85. The device of any of 81-84, wherein the pitch of the first interdigitated electrode and/or the second electrode is in a range of 50 nm to 100 μm.

86. The device of any of 81-85, wherein the pitch of the first interdigitated electrode and/or the second electrode is in a range of about 50 nm to about 100 μm, within a tolerance of ±0.1%, 0.2%, ±0.5%, or ±1.0%.

87. The device of any of 81-86, wherein a ratio of the pitch of the first interdigitated electrode and/or the second electrode to the thickness of the piezoelectric plate is selected to maintain an electro-mechanical coupling efficiency of at least 50% of a electro-mechanical coupling efficiency when the pitch of the first interdigitated electrode is equal to or approximately equal to the thickness of the piezoelectric plate.

88. The device of any of 81-87, wherein the first interdigitated electrode and/or the second electrode covers at least 10%, 20%, 25%, 30%, 40%, 50%, 60%, 70%, 75%, 80%, or 90% of the area of the top surface or the bottom surface.

89. The device of any of 81-88, wherein the first interdigitated electrode and/or the second electrode covers at least 35% of the area of the top surface or the bottom surface.

90. The device of any of 81-89, wherein the electrode width of each conductive strip is in a range of 10 nm to 10 μm.

91. The device of any of 81-90, wherein the electrode width of each conductive strip is in a range of about 10 nm to about 10 μm, within a tolerance of ±0.1%, ±0.2%, ±0.5%, or ±1.0%.

92. The device of any of 81-91, wherein an electrode thickness of each conductive strip ranges from 5% to 100% of the thickness of the piezoelectric plate.

93. The device of any of 81-92, wherein an electrode thickness of each conductive strip is 10% of the thickness of the piezoelectric plate.

94. The device of any of 81-93, wherein an electrode thickness of each conductive strip is about 10% of the thickness of the piezoelectric plate, within a tolerance of ±0.1%, ±0.2%, ±0.5%, or ±1.0%.

95. The device of any of 81-94, wherein the thickness of the piezoelectric plate is in a range of 100 nm to 100 μm or of 220 nm to 10 μm.

96. The device of any of 81-95, wherein the thickness of the piezoelectric plate is at least 220 nm.

97. The device of any of 81-96, wherein the piezoelectric plate is a piezoelectric material.

98. The device of any of 81-97, wherein the piezoelectric plate is selected from aluminum nitride, lithium niobate, lithium tantalite, zinc oxide, gallium nitride, scandium nitride, aluminum scandium nitride, and quartz, and combinations thereof.

99. The device of any of 81-98, wherein the piezoelectric plate comprises a combined coherent combination of $e_{33}$ and $e_{15}$ piezoelectric coefficients for multimodal excitation of the second and third order asymmetrical Lamb-wave overtones.

100. The device of any of 81-99, wherein the first interdigitated electrode and/or the second electrode is a conductive material.

101. The device of any of 81-100, wherein the first interdigitated electrode and/or the second electrode is a metal material.

102. The device of any of 81-101, wherein the first interdigitated electrode and/or the second electrode is selected from aluminum, ruthenium, molybdenum, and tungsten and combinations thereof.

103. The device of any of 81-102, wherein a frequency of the two-dimensional combined overtone mode is in a range of about 1 MHz to about 100 GHz, within a tolerance of ±0.1%, ±0.2%, ±0.5%, or ±1.0%.

104. The device of any of 81-103, wherein a frequency of the two-dimensional combined overtone mode is in a range of 1 MHz to 100 GHz.

105. The device of any of 81-104, wherein the device has an electro-mechanical coupling efficiency of 0.1% to 10.0%.

106. The device of any of 81-105, wherein the device has an electro-mechanical coupling efficiency of at least 0.1%, at least 0.2%, at least 0.3%, at least 0.4%, at least 0.5%, at least 0.6%, at least 0.7%, at least 0.8%, at least 0.9%, at least 1.0%, at least 1.2%, at least 1.4%, at least 1.6%, at least 1.8%, at least 2.0%, at least 2.5%, at least 3.0%, at least 3.5%, at least 4.0%, at least 4.5%, at least 5.0%, at least 6.0%, at least 7.0%, at least 8.0%, at least 9.0%, or at least 10.0%.

107. The device of any of 81-106, wherein the device has a quality factor of at least 10.

108. The device of any of 81-107, wherein the device has a quality factor of at least 200 or at least 500 or at least 1000 at a frequency of 6 GHz or greater.

109. The device of any of 81-108, wherein the device is operative in a frequency range of 1 MHz to 100 GHz.

110. The device of any of 81-109, wherein the device is operative in a frequency range of 6 GHz to 40 GHz.

111. The device of any of 81-110, wherein the circuitry comprises filter circuitry, circulator circuitry, or oscillator circuitry.

112. A filter comprising a plurality of combined overtone resonator devices of any of 81-111, the devices formed on a single substrate, each device tuned to a different frequency bandwidth.

113. The filter of any of 112, wherein the pitch of the first interdigitated electrode and/or the second electrode of each device is different from the pitch of the first interdigitated electrodes and/or the second electrodes of others of the plurality of devices.

114. The filter of any of 112-113, wherein the frequency bandwidth of each device is greater than 1 MHz.

115. The filter of any of 112-114, wherein the frequency bandwidth of each device ranges from 300 to 600 MHz.

116. The filter of any of 112-115, wherein an aggregated frequency bandwidth of the plurality of devices is greater than 1 MHz, greater than 1 GHz, or greater than 1.6 GHz.

117. A filter comprising:
 a plurality of combined overtone resonator devices, the devices formed on a single substrate, each device tuned to a different frequency bandwidth, each device comprising:
  a piezoelectric plate suspended from a substrate, the piezoelectric plate having a top surface, a bottom surface, a length direction, a width direction, and a thickness direction between the top surface and the bottom surface, the top surface and the bottom surface extending along the length direction and the width direction; and
  a first interdigitated electrode comprising a plurality of conductive strips disposed on the top surface of the piezoelectric plate, a second interdigitated electrode comprising a plurality of conductive strips disposed on the bottom surface of the piezoelectric plate, wherein each of the conductive strips has an electrode width substantially along the width direction, and wherein the plurality of conductive strips are arranged with a pitch substantially along the width direction;
  adjacent ones of the conductive strips on the top surface have opposite polarities, and each of the conductive strips on the bottom surface has a same polarity as a most closely overlying one of the conductive strips on the top surface; and
 wherein a two-dimensional mode of mechanical vibration is excited in a cross sectional plane of the piezoelectric plate in response to an alternating voltage applied through the interdigitated electrode and the second interdigitated electrode, the cross sectional plane extending along the width direction and the thickness direction, the two-dimensional mode of mechanical vibration comprising a two-dimensional combined overtone mode of second and third order asymmetrical Lamb-wave overtones.

118. The filter of 117, wherein the pitch of the first interdigitated electrode and/or the second electrode is equal to the thickness of the piezoelectric plate.

119. The filter of any of 117-118, wherein the pitch of the first interdigitated electrode and/or the second electrode is approximately equal to the thickness of the piezoelectric plate within a tolerance of ±0.1%, ±0.2%, ±0.5%, or ±1.0%.

120. The filter of any of 117-119, wherein the pitch of the first interdigitated electrode and/or the second electrode is within 50%, within 40%, within 30%, within 20%, within 10%, within 5%, within 2%, within 1%, or within 0.5% of the thickness of the piezoelectric plate.

121. The filter of any of 117-120, wherein the pitch of the first interdigitated electrode and/or the second electrode is in a range of 50 nm to 100 μm.

122. The filter of any of 117-121, wherein the pitch of the first interdigitated electrode and/or the second electrode is in a range of about 50 nm to about 100 μm, within a tolerance of ±0.1%, ±0.2%, ±0.5%, or ±1.0%.

123. The filter of any of 117-122, wherein a ratio of the pitch of the first interdigitated electrode and/or the second electrode to the thickness of the piezoelectric plate is selected to maintain an electro-mechanical coupling efficiency of at least 50% of a electro-mechanical coupling efficiency when the pitch of the first interdigitated electrode is equal to or approximately equal to the thickness of the piezoelectric plate.

124. The filter of any of 117-123, wherein the first interdigitated electrode and/or the second electrode covers at least 10%, 20%, 25%, 30%, 40%, 50%, 60%, 70%, 75%, 80%, or 90% of the area of the top surface or the bottom surface.

125. The filter of any of 117-124, wherein the first interdigitated electrode and/or the second electrode covers at least 35% of the area of the top surface or the bottom surface.

126. The filter of any of 117-125, wherein the electrode width of each conductive strip is in a range of 10 nm to 10 μm.

127. The filter of any of 117-126, wherein the electrode width of each conductive strip is in a range of about 10 nm to about 10 μm, within a tolerance of ±0.1%, ±0.2%, ±0.5%, or ±1.0%.

128. The filter of any of 117-127, wherein an electrode thickness of each conductive strip ranges from 5% to 100% of the thickness of the piezoelectric plate.

129. The filter of any of 117-128, wherein an electrode thickness of each conductive strip is 10% of the thickness of the piezoelectric plate.

130. The filter of any of 117-129, wherein an electrode thickness of each conductive strip is about 10% of the thickness of the piezoelectric plate, within a tolerance of ±0.1%, ±0.2%, ±0.5%, or ±1.0%.

131. The filter of any of 117-130, wherein the thickness of the piezoelectric plate is in a range of 100 nm to 100 μm or of 220 nm to 10 μm.

132. The filter of any of 117-131, wherein the thickness of the piezoelectric plate is at least 220 nm.

133. The filter of any of 117-132, wherein the piezoelectric plate is a piezoelectric material.

134. The filter of any of 117-133, wherein the piezoelectric plate is selected from aluminum nitride, lithium niobate, lithium tantalite, zinc oxide, gallium nitride, scandium nitride, aluminum scandium nitride, and quartz, and combinations thereof.

135. The filter of any of 117-134, wherein the piezoelectric plate comprises a combined coherent combination of $e_{33}$ and $e_{15}$ piezoelectric coefficients for multimodal excitation of the second and third order asymmetrical Lamb-wave overtones.

136. The filter of any of 117-135, wherein the first interdigitated electrode and/or the second electrode is a conductive material.

137. The filter of any of 117-136, wherein the first interdigitated electrode and/or the second electrode is a metal material.

138. The filter of any of 117-137, wherein the first interdigitated electrode and/or the second electrode is selected from aluminum, ruthenium, molybdenum, and tungsten and combinations thereof.

139. The filter of any of 117-138, wherein a frequency of the two-dimensional combined overtone mode is in a range of about 1 MHz to about 100 GHz, within a tolerance of ±0.1%, ±0.2%, ±0.5%, or ±1.0%.

140. The filter of any of 117-139, wherein a frequency of the two-dimensional combined overtone mode is in a range of 1 MHz to 100 GHz.

141. The filter of any of 117-140, wherein the device has an electro-mechanical coupling efficiency of 0.1% to 10.0%.

142. The filter of any of 117-141, wherein the device has an electro-mechanical coupling efficiency of at least 0.1%, at least 0.2%, at least 0.3%, at least 0.4%, at least 0.5%, at least 0.6%, at least 0.7%, at least 0.8%, at least 0.9%, at least 1.0%, at least 1.2%, at least 1.4%, at least 1.6%, at least 1.8%, at least 2.0%, at least 2.5%, at least 3.0%, at least 3.5%, at least 4.0%, at least 4.5%, at least 5.0%, at least 6.0%, at least 7.0%, at least 8.0%, at least 9.0%, or at least 10.0%.

143. The filter of any of 117-142, wherein the device has a quality factor of at least 10.

144. The filter of any of 117-143, wherein the device has a quality factor of at least 200 or at least 500 or at least 1000 at a frequency of 6 GHz or greater.

145. The filter of any of 117-144, wherein the device is operative in a frequency range of 1 MHz to 100 GHz.

146. The filter of any of 117-145, wherein the device is operative in a frequency range of 6 GHz to 40 GHz.

147. The filter of any of 117-146, wherein the pitch of the first interdigitated electrode and/or the second electrode of each device is different from the pitch of the first interdigitated electrodes and/or the second electrodes of others of the plurality of devices.

148. The filter of any of 117-147, wherein the frequency bandwidth of each device is greater than 1 MHz.

149. The filter of any of 117-148, wherein the frequency bandwidth of each device ranges from 300 to 600 MHz.

150. The filter of any of 117-149, wherein an aggregated frequency bandwidth of the plurality of devices is greater than 1 MHz, greater than 1 GHz, or greater than 1.6 GHz.

DETAILED DESCRIPTION

I. Introduction

Figure 1A:
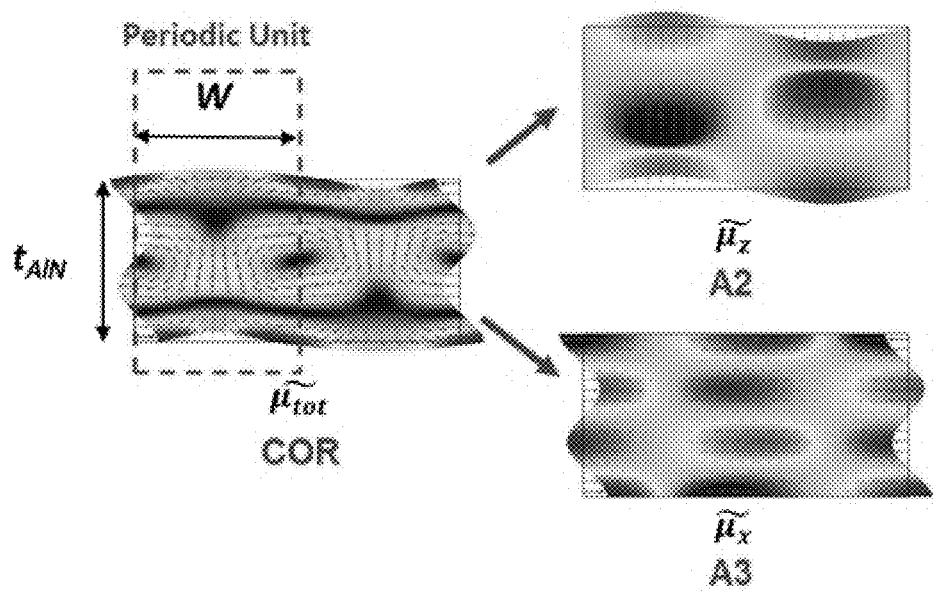
FIG. 1A illustrates the FEM-simulated modeshape of two periodic units (N=2) of an AlN Combined Overtone Resonator (COR) for $t_{AlN}$=1 µm and W=1 µm. This COR operates at 9771 MHz.

The development of wireless communication systems has been steadily growing and conventional sub-6 GHz frequency bands are too congested to meet the high data rate requirements of several emerging technologies. For example, connected-vehicle-to-everything communication (V2X) systems have been recently developed to allow vehicles to communicate with moving parts of the traffic system around them to increase awareness of all surroundings, reduce the risk of collisions, and maximize the transportation efficiency. This technology requires high-bandwidth, low-latency and high-reliability short-range wireless links to communicate with compatible systems on vehicles, pedestrians and infrastructures. The 5G cellular network can be considered the key enabler for such a ubiquitous and pervasive mobile internet connectivity. In particular, the use of the millimeter wave (mmWave) spectrum represents a major leap forward in the 5G network, as it enables improvements in data speed, capacity, quality and latency that are unimaginable in 3G and 4G networks. 5G frequency bands from 6 GHz to 40 GHz are typically referred to as cm-mmWave in the industry. Unlike sub-6 GHz spectrum with bandwidth (BW) typically between 5 MHz and 20 MHz, 5G cm-mmWave spectrum provides contiguous bandwidths (BWs) from 40 MHz up to 2 GHz. This high-band spectrum enables data rates in the tens of Gbps range with extremely low latency, providing significant opportunities for very high throughput services, such as Enhanced Mobile Broadband (eMBB), Ultra Reliable Low Latency Communications (URLLC), and Massive Machine Type Communications (mMTC). It is worth noting that the first set of high-band auctions, concluded by the Federal Communications Commission (FCC) in May 2019, offered more than 2,900 Upper Microwave Flexible Use Service licenses in the 24 GHz band: the lower segment of the 24 GHz band (24.25-24.45 GHz) is licensed as two 100-megahertz blocks, while the upper segment (24.75-25.25 GHz) is licensed as five 100-megahertz blocks. These 5G 24 GHz bands are closely located to the 23.8 GHz band that is used for sensitive meteorological and oceanographic measurements; therefore, the adoption of these 5G bands in communication systems requires the use of pass-band filters with a relatively small fractional bandwidth of ~0.42% (i.e. 100 MHz) and a high Q>500 to achieve the steep roll-off and the large out-of-band rejection needed to enable coexistence with the adjacent band.

Therefore, the technology described herein can provide a solution to address this 5G mmWave filter challenge. The technology provides high-performance filters for the mmWave that can enable the miniaturization and integration of 5G systems desirable for a ubiquitous and pervasive mobile internet connectivity.

Although the electromagnetic (EM) wavelengths are significantly reduced at mmWave, the dimensions of conventional EM based filters are still more than 600 times larger than what could be achieved with the acoustic counterparts, making them not suitable for the implementation of next generation miniaturized mobile devices. Also, the low quality factor of EM filters results in poor roll-off which renders the system vulnerable to crosstalk from adjacent channels.

Micro-electro-mechanical system (MEMS) components, especially Surface Acoustic Wave (SAW) and Bulk Acoustic Wave (BAW) resonators, have been employed as radio frequency (RF) filters in current mobile devices for frequency band selection due to the high-quality factor, high electromechanical coupling coefficient (corresponding to high fractional BW) and small form-factor that they can achieve in the sub-6 GHz range. Nevertheless, when scaled above 6 GHz, all the existing micro-acoustic resonator technologies resonators have suffered critical limitations associated with increased acoustic losses and aggressively scaled dimensions that have prevented the synthesis of high performance filters based on these technologies.

SAW filters operating at 15 GHz were demonstrated employing 145 nm wide interdigital (IDT) electrodes. However, an insertion loss >40 dB was measured for these devices due to their heavily degraded Q (commercially available SAW filters show I.L.<1 dB in 1 GHz range). Aluminum nitride (AlN) BAW resonators in X band and K band were also demonstrated. Although these high frequency BAW resonators maintain an electromechanical coupling coefficient $(k_t^2)$>6% (enabled by the high piezoelectric coefficient, $e_{33}$, employed to transduce vibration), they show very low Q-values (~300), which are 10 times lower than the ones typically achieved by the same technology in the sub-6 GHz frequency bands, resulting in the synthesis of filters with high insertion loss of 3.8-11 dB (I.L.$\propto k_t^2 \cdot Q$). This drastic performance degradation is associated with the fact that ultra-thin piezoelectric and metal layers are required to achieve thickness-extensional vibration at mmWave frequencies. For example, the excitation of a 24 GHz thickness-extensional mode of vibration requires the use of an ultra-thin material stack composed of a 120 nm thick AlN piezoelectric layer and 17 nm thick ruthenium (Ru) electrodes. Studies have shown that the first few tens of nanometers of a deposited AlN thin-film are not properly oriented along the c-axis, resulting in degraded piezoelectric coupling and quality factor Q. In particular, it was experimentally demonstrated that the X-Ray diffraction (XRD) full width at half-maximum (FWHM, an indication of crystal quality with smaller values corresponding to better crystal orientation) increases dramatically when the deposited AlN film is thinner than 250 nm. For example, while the FWHM increases by 10% when the AlN film is scaled from 1000 nm to 250 nm, the degradation is more than 20% when it is scaled to 100 nm. In contrast, the present technology can employ AlN films thicker than 200 nm in the manufacture of micro-acoustic resonators in order to avoid the consequences of thin-film material degradation. In addition to the issues associated with the use of reduced quality ultra-thin piezoelectric films, the performance of the resonator is also significantly affected by the use of ultra-thin metal electrodes that unavoidably introduce a large electrical resistance that dramatically reduces the loaded Q of the resonator. For these reasons, to date AlN BAW resonators, or any other piezoelectric resonators, have not been successfully scaled to operate above 6 GHz without a significant performance degradation which has prevented the implementation of performing mmWave filters.

In order to synthesize performing mmWave filters, resonators with high Q-values larger than 500 are required. The use of high Q resonators enables the achievement of the steep roll-off required for the implementation of contiguous filters separated by a minimum guard band for efficient spectrum usage. The use of high-Q resonators also enables more flexibility in the filter design with trade-off possibilities between filter rejection and bandwidth. Furthermore, the insertion loss (I.L.) heavily depends on the resonator Q when resonators with relatively modest $k_t^2$ values are employed to synthesize relatively narrow fractional bandwidth filters (FBW) ($k_t^2$<0.8% for 100 MHz BW at 24 GHz).

In this context, overtone resonators are advantageous as they typically achieve high Q at very high frequencies due to reduced air damping and acoustic loss. However, their $k_t^2$-values are dramatically reduced as they scale inversely proportional to the cube of the order number.

The technology described herein provides a class of acoustic resonators, aluminum nitride (AlN) combined overtone resonators (CORs), that can overcome the aforementioned fundamental challenges. CORs rely on the piezoelectric multimodal excitation of two higher-order Lamb waves (the $2^{nd}$ and $3^{rd}$ order Asymmetrical Lamb Waves, i.e. A2 and A3) to transduce a 2-dimensional (2D) mechanical mode of vibration in the cross-section of a suspended thin-film AlN plate. A combination of multiple overtone modes is employed to achieve a more efficient piezoelectric transduction. Exploiting the multimodal excitation of combined overtones, CORs can operate in the mmWave spectrum while maintaining relaxed lithographic requirements (minimum feature>100 nm) and relatively thick AlN films (>220 nm), which eliminate the performance degradation issues associated with ultra-thin film materials and directly translates in the achievement of high Q>1000. Furthermore, thanks to the coherent combination of the $e_{33}$ and $e_{15}$ piezoelectric coefficients of AlN employed to transduce the combined overtone 2D mechanical mode of vibration, CORs achieve relatively high electromechanical coupling coefficient $k_t^2$ (0.8% to 1.9%) despite the use of higher order modes (i.e. overtones) in the structure. Also, due to the dependence of this combined overtone 2D vibrational mode on both the vertical and the lateral dimensions of the structure, the resonant frequencies of CORs can be lithographically tuned to synthesize monolithic multi-frequency filters on the same chip with minimal fabrication complexity. Therefore, mmWave CORs can simultaneously achieve high Q-values >1000 and relatively high electromechanical coupling coefficient $k_t^2$ (0.8%~1.9%) suitable for the implementation of contiguous filters (bandwidth from 300 to 592 MHz) for aggregated bandwidth from 1.6 to 2.6 GHz on the same substrate in the 24-40 GHz frequency range.

II. Principle of Operation

Lamb wave theory has been studied to identify all vibration modes that can be described by a one-dimensional (1-D) displacement vector in a plate. This theoretical model for analyzing and optimizing Lamb wave resonators is adopted here to describe the 2-D motion of aluminum nitride (AlN) combined overtone resonators (CORs).

AlN CORs are formed by a suspended AlN thin film and use one (i.e. top electrode-only configuration) or two (i.e. top and bottom electrodes configuration) interdigital transducer (IDT) electrodes for the piezoelectric multimodal excitation of the $2^{nd}$ and $3^{rd}$ order asymmetrical Lamb-wave overtones (A2 and A3 respectively), resulting into a 2-dimensional (2D) combined overtone mode (COM) of vibration in the cross-section of a suspended thin-film AlN plate. This COM is excited in the structure when the thickness of the AlN layer, $t_{AlN}$, is approximately equal to the pitch, W, of the employed IDT. Such a COM is characterized by a 2D displacement vector with components along both the lateral ($\widetilde{\mu_x}$) and vertical ($\widetilde{\mu_z}$) directions of the plate. It is worth noting that $\widetilde{\mu_x}$, corresponds to the vibration modeshape of the A3 mode while $\widetilde{\mu_z}$, corresponds to the vibration modeshape of the A2 mode. The general expression of ($\widetilde{\mu_x}$) and ($\widetilde{\mu_z}$) for the A2-A3 COM is provided in (1), assuming infinite periodic boundary conditions in both directions:

$$\begin{bmatrix} \widetilde{\mu_x} \\ \widetilde{\mu_z} \end{bmatrix} = \begin{bmatrix} \overline{X}A(x)B(z) \\ \overline{Z}C(x)D(z) \end{bmatrix} = \begin{bmatrix} -\overline{X}\cos(\beta_x x)\cos(\beta_{z\_x} z) \\ -\overline{Z}\sin(\beta_x x)\cos(\beta_{z\_z} z) \end{bmatrix} \quad (1)$$

where $\overline{X}$ and $\overline{Z}$ are the magnitudes of the displacement components along the x- and z-directions, respectively; $\beta_x$ is the wave-vector relative to the motion along the x-directions for both $\widetilde{\mu_x}$ and $\widetilde{\mu_z}$; $\beta_{z\_x}$ and $\beta_{z\_z}$ are the wave-vectors relative to the motion along the z-directions for $\widetilde{\mu_x}$ and $\widetilde{\mu_z}$, respectively. The expressions describing the three wave-vectors are provided in (2), (3), and (4).

$$\tilde{\beta}_x = \frac{\pi}{W} \quad (2)$$

$$\tilde{\beta}_{z\_x} = \frac{3\pi}{t_{AlN}} \quad (3)$$

$$\tilde{\beta}_{z\_z} = \frac{2\pi}{t_{AlN}} \quad (4)$$

where W is the pitch of interdigital transducer (IDT) electrodes employed to transduce the COM and $t_{AlN}$ is the thickness of the AlN plate. Note that all the three wave vectors have different mode orders, resulting in vortexes in the total displacements field.

Figure 1B:
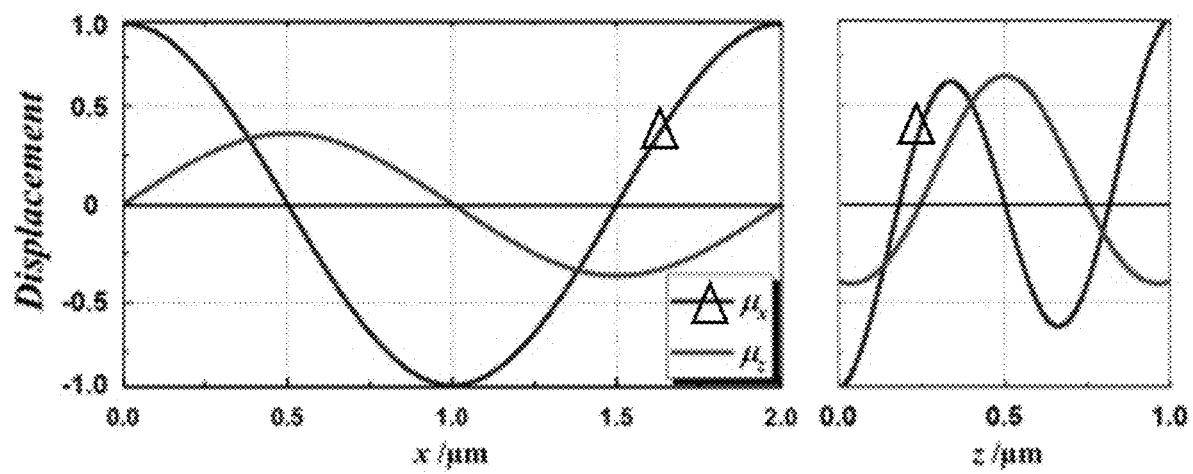
FIG. 1B illustrates the displacement components in x- and z-directions of the simulations of FIG. 1A. The effect of electrodes was not included in the simulations. Normalized $\widetilde{\mu_x}$; and $\widetilde{\mu_z}$ along the lateral direction (left) and the thickness direction (right) of COR.

The vibration modeshape of the COM was simulated by finite-element method (FEM) in COMSOL, as shown in FIGS. 1A and 1B. The simulation was performed using two periodic unit cells (finger number N=2) with periodic boundary conditions along $\hat{z}$ and stress-free boundary conditions in $\hat{z}$. The FEM simulated modeshape of the COM in FIG. 1A matches well to the analytical description by equations 1-4 with small deviations along the z-direction due to the lack of periodic boundary conditions (i.e. stress-free boundaries on the top and bottom surfaces of the FEM model). The FEM simulated modeshapes of both $\widetilde{\mu_x}$ and $\widetilde{\mu_z}$ are also reported in FIG. 1A highlighting the clear matching with the displacement profiles of the A3 and A2 modes, respectively.

A. Piezoelectric Coupling Efficiency

Multiple parameters have been used in the literature to describe the piezoelectric coupling efficiency of resonators. Particularly important is the electromechanical coupling coefficient, $k_t^2$, which is a quantitative measure of the conversion between the electrical and mechanical energy in the electromechanical resonator:

$$k_t^2 = \frac{\pi^2}{8} \frac{f_p^2 - f_s^2}{f_s^2} \quad (5)$$

where $f_s$ and $f_p$ are the series and parallel resonant frequencies of the resonator, respectively.

Another useful parameter is the piezoelectric coupling constant, $K^2$, which identifies the maximum $k_t^2$ that can be achieved for any mode of vibration through optimal excitation. $K^2$ can be evaluated using (5) with $f_s$ and $f_p$ replaced by $f_o$ and $f_m$, as in (6), where $f_o$ and $f_m$ are the non-metallized and the metallized resonant frequencies of the resonator, respectively. Therefore, $K^2$ can be readily computed using the dispersion characteristics of the resonator.

$$K^2 = \frac{\pi^2}{8} \frac{f_o^2 - f_m^2}{f_m^2} \quad (6)$$

Figure 2:
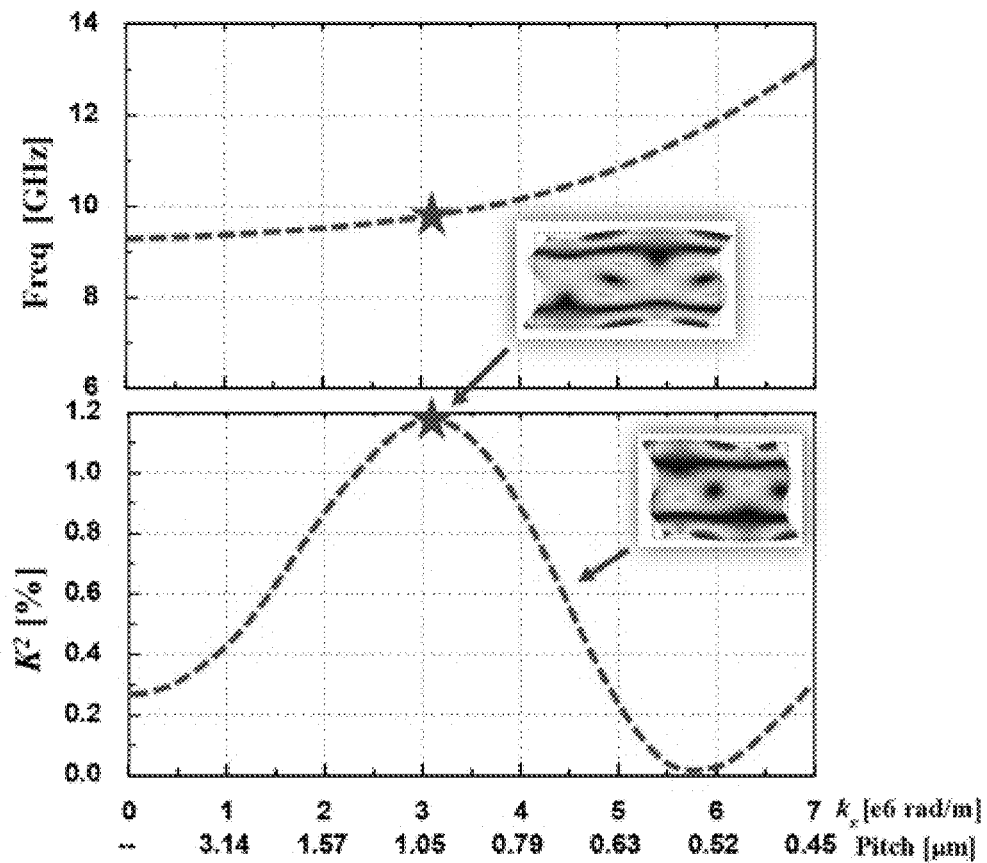
FIG. 2 illustrates a dispersion curve and $K^2$-values of the COM excited in a 1 µm-thick AlN plate for different values of its width (W). The highest $K^2$ value and its corresponding frequency are marked by the stars. The modeshapes for W=1 µm and W=0.7 µm are shown in the insets.

In this work, FEM simulations were performed in COMSOL Multiphysics to study the piezoelectric coupling constant of the COM in a suspended AlN plate. Both the resonant frequencies and the $K^2$ values were computed for a 1 μm thick AlN while varying its lateral dimension W (i.e. the wave number $k_x$) (FIG. 2). As evident, a maximum $K^2$-value of ~1.2% is achieved when the AlN thickness, $t_{AlN}$, is approximately equal to W. Note that this $K^2$-value is the highest ever predicted for any overtone mode excited in an AlN plate. Note also that the presence of the metal electrode, which is not included in this analysis, but it is required in an actual COR implementation, further increases the maximum achievable $k_t^2$ as explained in the following sections.

Generally, AlN resonators rely on one or more piezoelectric coefficients such as, $e_{31}$, $e_{33}$, and $e_{15}$, to transduce a mechanical mode of vibration. Since the COM is characterized by a 2D displacement vector with a shear vibration component along the lateral direction ($\widetilde{\mu_x}$) and a longitudinal vibration component along the vertical ($\widetilde{\mu_z}$) direction of the plate, the coherent combination of the $e_{15}$ and $e_{33}$ piezoelectric coefficients of AlN is exploited for its transduction.

The analytical model proposed by Berlincourt et. al. was considered to investigate the effect of different excitation schemes on the $k_t^2$-values of a device with a volume Ω:

$$k_t^2 = \frac{\pi^2}{8} \frac{U_{coupling}^2}{U_m U_e} \quad (7)$$

where $$U_m = \frac{1}{2} \int_\Omega T_i S_{ij}^E T_j d\Omega \quad (8)$$

$$U_{coupling} = \frac{1}{4} \int_\Omega (T_i e_{ni} E_n + E_n e_{ni} T_i) d\Omega \quad (9)$$

$$U_e = \frac{1}{2} \int_\Omega E_m \varepsilon_{mn}^T E_n d\Omega \quad (10)$$

Here $U_m$ is the mechanical energy, $U_{coupling}$ is the energy associated with the coupled electrical mechanical domain (mutual energy) and $U_e$ is the electrical energy carried over the resonator volume Ω. m, n=1, 2, 3 and i, j=1, 2, 3, 4, 5, 6.

$E_m$ is the component of the electric field vector. $T_i$ is the component of the stress. $e_{mn}$, $\varepsilon_{mn}^T$ and $s_{ij}^E$ are the piezoelectric coefficient, the dielectric constant and the elastic compliance, respectively.

Equations (7)-(10) provide further insights for the design and the optimization of the excitation scheme employed to transduce vibration in the structure. In particular, (9) indicates that the higher is the integral of the product of electric and stress fields in space the higher is the $k_t^2$. Therefore, the design of an excitation scheme providing an electric field distribution matching the stress field of the COM in the structure is critical to maximize the coupling.

Figure 3A:
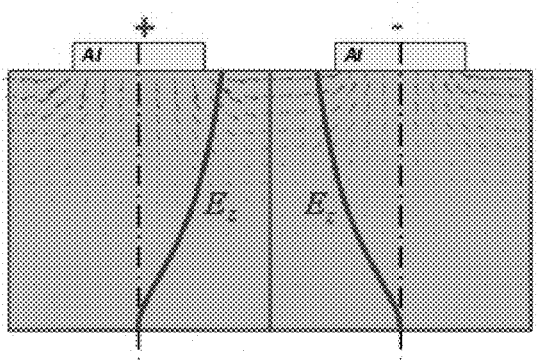
FIGS. 3A, 3B, and 3C illustrate electric field distributions for electrical configurations (FIG. 3A) LFE, (FIG. 3B) TEF-1 and (FIG. 3C) TFE-2. The directions and length of arrows represent the direction and strength of the electric field vectors. The bold lines represent the electric field component $E_z$ (in the mid-plane of each unit) across the thickness, and on the right side of the dash-dotted line indicates positive sign and vice versa.
Figure 3B:
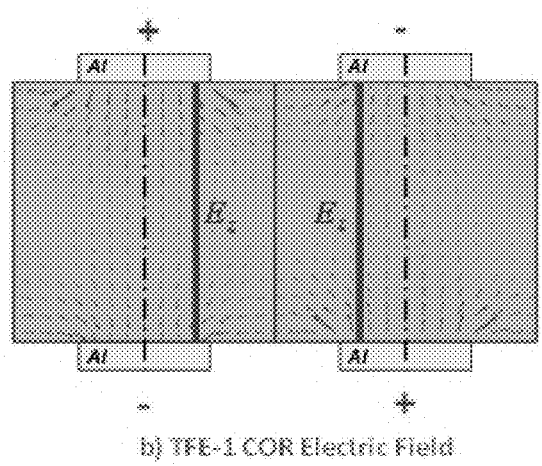
Figure 3C:
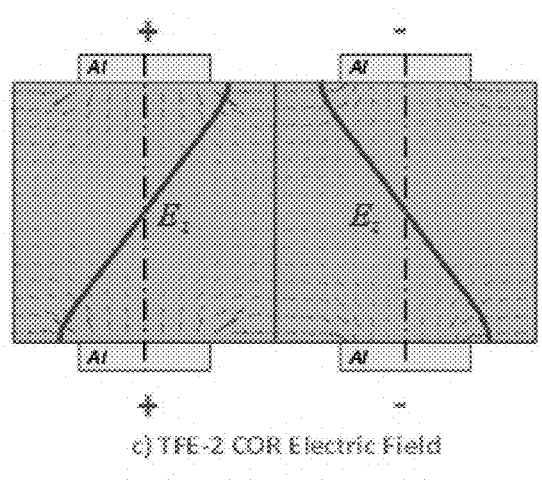

CORs can use two main kinds of excitation schemes: the Thickness-Field-Excited (TFE) configuration, using both top and bottom IDT electrode, and the Lateral-Field-Excited (LFE) configuration, using only a top IDT (or only a bottom IDT) electrode. The LFE configuration employs metal fingers with alternating electrical polarities on the top (or the bottom) of the resonator, as shown in FIG. 3A. The typical TFE configuration (referred as TFE-1) employs metal fingers with inversed electrical polarity between top and bottom, as shown in FIG. 3B. An unconventional TFE configuration (referred as TFE-2) is also proposed and examined here, which employs metal fingers with the same electrical polarities on the top and the bottom of the resonator, as shown in FIG. 3C.

Figure 3D:
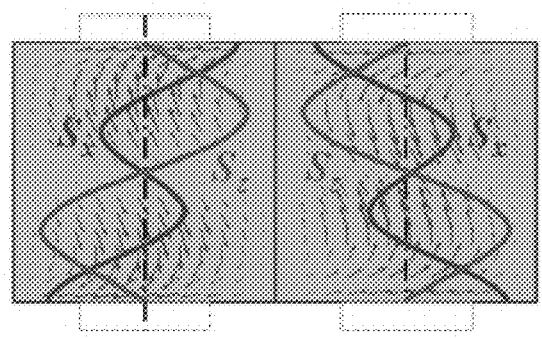
FIG. 3D illustrates the asymmetric stress field distributions for CORs without the mass loading of the IDT.
Figure 4A:
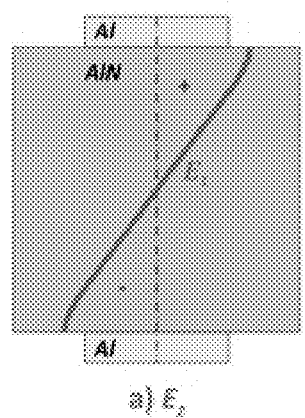
FIG. 4A illustrates $E_z$ for TFE-2.
Figures 4B, 4C:
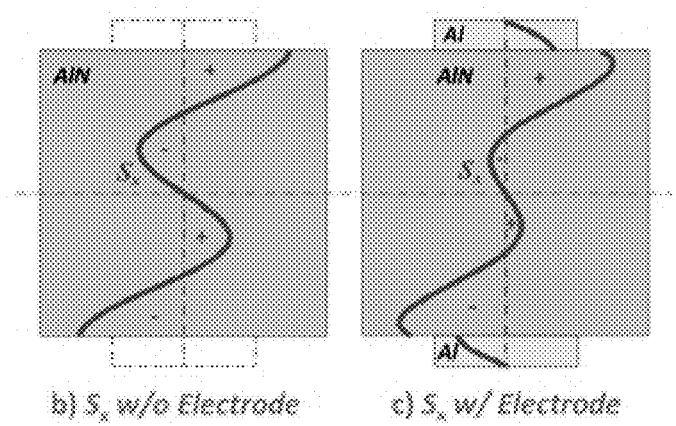
FIGS. 4B and 4C illustrate $S_x$ distribution in the center of a periodic unit of CORs (FIG. 4B) without and (FIG. 4C) with the mechanical effects of electrodes.
Figures 4D, 4E:
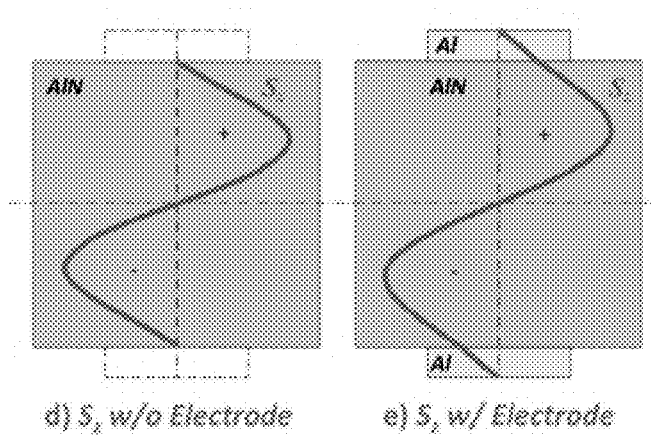
FIGS. 4D and 4E illustrate $S_z$ distribution in the center of a periodic unit of CORs (FIG. 4D) without and (FIG. 4E) with the mechanical effects of electrodes.

The choice of the excitation scheme affects the electric field distributions in the piezoelectric film and therefore the value of $k_t^2$ for a given mode of vibration (i.e. given stress field distribution). The electric field distributions for the 3 different excitation schemes were simulated by FEM and reported in FIGS. 3A-3C while the simulated stress field distribution of a COM, neglecting the IDT mass loading effect, is plotted in FIG. 3D. The simulation results indicate that the conventional symmetric electric field distribution provided by the TFE-1 scheme is not suitable for the transduction of the COM as it results in a mutual energy, ($U_{coupling}$~0. On the other hand, the asymmetrical electric field distribution provided by the LFE and TFE-2 configurations match the asymmetrical stress field of the COM resulting in a non-zero mutual energy value. In particular, the unconventional TFE-2 excitation scheme best matches the stress field of the COM enabling the efficient piezoelectric excitation of even-order overtones (i.e. A2, A4 etc.) which results in a high electromechanical coupling coefficient $k_t^2$ for the COM.

The effect of the electrode mass loading on the stress field distribution was also analyzed by FEM. The simulated electric field component, $E_z$, and stress field components, $S_x$ and $S_z$, in the center of a periodic unit cell are plotted in FIGS. 4A-4E. The simulation results clearly show that the mechanical loading of the metal electrodes modifies the stress field distribution of the COM improving further the matching with the electric field distribution provided by the TFE-2 scheme (particularly in the middle region of the material stack). As a result, significantly higher $k_t^2$-values can be achieved in an actual COR implementation employing metal IDT electrodes.

The choices of the electrode materials and thicknesses are also important factors affecting the device $k_t^2$. Ruthenium (Ru), molybdenum (Mo), and tungsten (W) are widely adopted electrode materials for BAW resonators as they provide good crystal interfaces for the growth of highly c-oriented AlN with excellent piezoelectric properties. However, the use of these metals significantly decreases the device resonant frequency due to their high density and stiffness. High quality AlN thin-films(FWHM=1.05°, as good as the one obtained on top of Ru, Mo or W, can be attained also on top of lighter metals, such as aluminum (Al), representing a valid alternative for the implementation of resonators operating above 6 GHz. For this reason, Al was chosen as electrode material for the analysis and the experiments presented in this work.

Figure 5A:
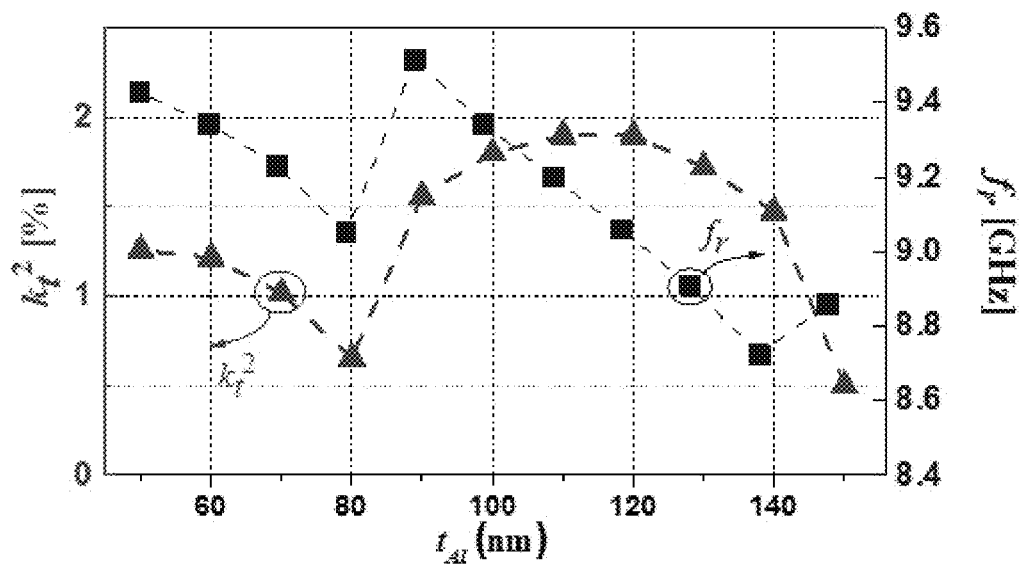
FIGS. 5A and 5B illustrate $k_t^2$-values and resonant frequencies $f_r$ for different Al thickness ($t_{Al}$) of CORs based on (FIG. 5A) TFE-2 and (FIG. 5B) LFE configurations. AlN thickness ($t_{AlN}$) is fixed at 1 µm. W=1.1 µm, N=2, α=50%, $t_{Al}$=110 nm for TFE-2. W=1.15 µm, N=2, α=35%, $t_{Al}$=120 nm for LFE.
Figure 5B:
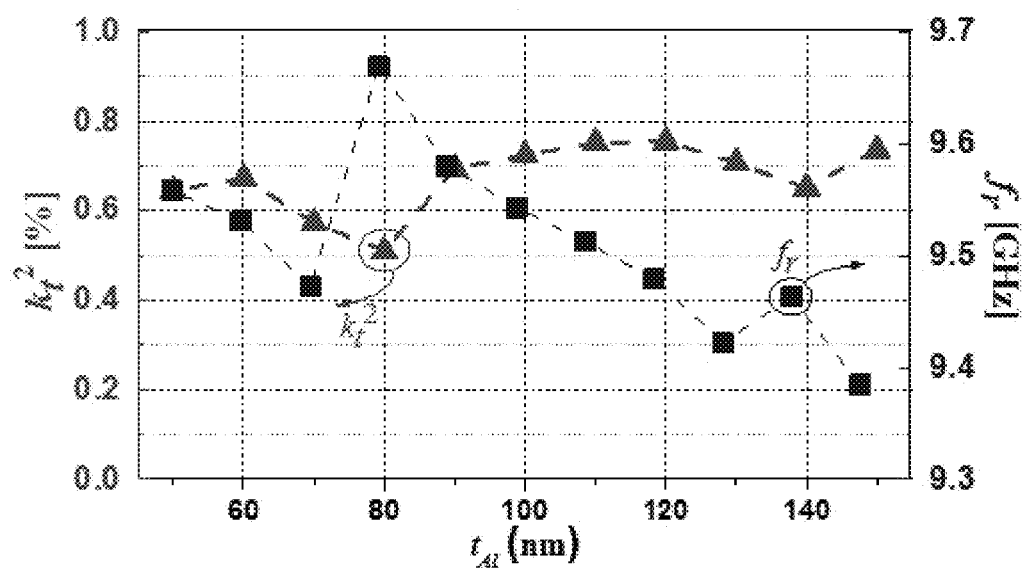

Different thicknesses of the Al electrodes were simulated to find the optimal value that maximizes the $k_t^2$-values for the TFE-2 configuration. As shown in FIG. 5A, a maximum $k_t^2$-value of 1.9% was found for an optimal ratio of AlN to Al of 1000 nm to 110 nm for the TFE-2 CORs. This represents a more than 60% increase in $k_t^2$ compared to the electrode-less case (FIG. 2). As a comparison, resonators relying on fundamental modes of vibrations (such as conventional BAW resonators) typically show a 14% increment in V associated to the presence of metal electrodes. A similar study was performed for the LFE configuration (top Al IDT electrode only) showing a maximum $k_t^2$-value of 0.8% for optimized vertical and lateral dimensions (IDT pitch W and metallic coverage a) of the resonator stack, as shown in FIG. 5B.

B. Quality Factor Q

The quality factor Q of a piezoelectric resonators is defined as the ratio between stored and dissipated energies. The total quality factor $Q_{total}$ can be generally expressed as in (11):

$$\frac{1}{Q_{total}} = \frac{1}{Q_{anchor}} + \frac{1}{Q_{interface}} + \frac{1}{Q_{material}} + \frac{1}{Q_{electrical}} + \frac{1}{Q_{dielectric}} + \frac{1}{Q_{intrinsic}} \quad (11)$$

The anchor loss, $1/Q_{anchor}$, describes the acoustic energy lost through the anchor to the substrate. The typical frame designs for energy confinement employed for lower frequency resonators cannot be readily applied to higher frequency devices due to their reduced dimensions. As can be seen from the modeshape in FIG. 1A, COM has a strong shear vibration which is characterized by high Q. Therefore, the energy is naturally well confined inside the resonator body. The interface loss, $1/Q_{interface}$, is caused by the plane stress jump at the interface between the piezoelectric layer and the metal electrode. As shown in the COR modeshape simulation in FIG. 1A, the IDT electrodes are placed in the center of each periodic unit where the displacement is minimum, which minimizes the scattering of the acoustic wave at the electrode-AlN interface and the associated damping. The material loss, $1/Q_{material}$, is related to the presence of defects in the crystal. Since high operating frequency is achieved in CORs while using an AlN layer thicker than the one employed by more conventional technologies operating in the same frequency range, the material loss is mitigated in CORs. The electrical loss, $1/Q_{electrical}$, is determined by the ohmic losses of the metal electrodes and the electrical routing. The use of overtones in a relatively thick AlN layer allows the use of sufficiently thick metal electrodes with minimal electrical loading effect. The dielectric loss, $1/Q_{dielectric}$, is determined by the inherent dissipations of electromagnetic energy in the dielectric material which are reduced in the sufficiently thick AlN films employed in CORs. In fact, it was experimentally shown that the dielectric loss increases rapidly only when the AlN film is scaled below 250 nm. Other dissipative mechanisms intrinsic to the resonating material, $1/Q_{intrinsic}$, include thermoelastic, phonon-electron, and phonon-phonon interactions. The Akheiser theory predicts that the $f$-$Q_{intrinsic}$ product of AlN increases linearly with frequency for frequencies larger than ~1 GHz, enabling the achievement of high $Q_{intrinsic}$ in cm-mmWave AlN resonators.

In summary, it can be qualitatively concluded that most of the energy loss mechanisms are mitigated in CORs due to the use of overtones in a relatively thick material stack.

III. Contiguous COR Filters for 5G mmWave Spectrum

Frequency scaling of existing micro-resonator technologies up to the mmWave range has not been successful to date due to the severe performance degradation associated with the required aggressive scaling in both the vertical and lateral dimensions of the resonator. This fundamental challenge, that has so far prevented the implementation of performing mmWave micro-acoustic filters, is overcome by the COR technology. In fact, thanks to the use of a combined overtone mode of vibration the operating frequency of CORs can be scaled up to mmWave frequencies while maintaining relaxed lithographic requirements (minimum feature>100 nm) and relatively thick AlN films (>220 nm) (Table I and Table II).

TABLE I

DIMENSIONS FOR LFE CORS OF DIFFERENT FREQUENCIES

| Freq [GHz] | W [nm] | $t_{AlN}$ [nm] | $t_{Al}$ [nm] |
|---|---|---|---|
| 24 | 431 | 375 | 45 |
| 25 | 414 | 360 | 43 |
| 26 | 398 | 346 | 42 |
| 27 | 383 | 333 | 40 |
| 28 | 370 | 321 | 39 |
| 29 | 357 | 310 | 37 |
| 30 | 345 | 300 | 36 |
| 31 | 334 | 290 | 35 |
| 32 | 323 | 281 | 34 |
| 33 | 314 | 273 | 33 |
| 34 | 304 | 265 | 32 |
| 35 | 296 | 257 | 31 |
| 36 | 288 | 250 | 30 |
| 37 | 280 | 243 | 29 |
| 38 | 272 | 237 | 28 |
| 39 | 265 | 231 | 28 |
| 40 | 259 | 225 | 27 |

TABLE II

DIMENSIONS FOR TFE-2 CORS OF DIFFERENT FREQUENCIES

| Freq [GHz] | W [nm] | $t_{AlN}$ [nm] | $t_{Al}$ [nm] |
|---|---|---|---|
| 24 | 422 | 383 | 42 |
| 25 | 405 | 368 | 40 |
| 26 | 389 | 354 | 39 |
| 27 | 375 | 341 | 37 |
| 28 | 361 | 329 | 36 |
| 29 | 349 | 317 | 35 |
| 30 | 337 | 307 | 34 |
| 31 | 326 | 297 | 33 |
| 32 | 316 | 288 | 32 |
| 33 | 307 | 279 | 31 |
| 34 | 298 | 271 | 30 |
| 35 | 289 | 263 | 29 |
| 36 | 281 | 256 | 28 |
| 37 | 274 | 249 | 27 |
| 38 | 266 | 242 | 27 |
| 39 | 259 | 236 | 26 |
| 40 | 253 | 230 | 25 |

Figure 10:
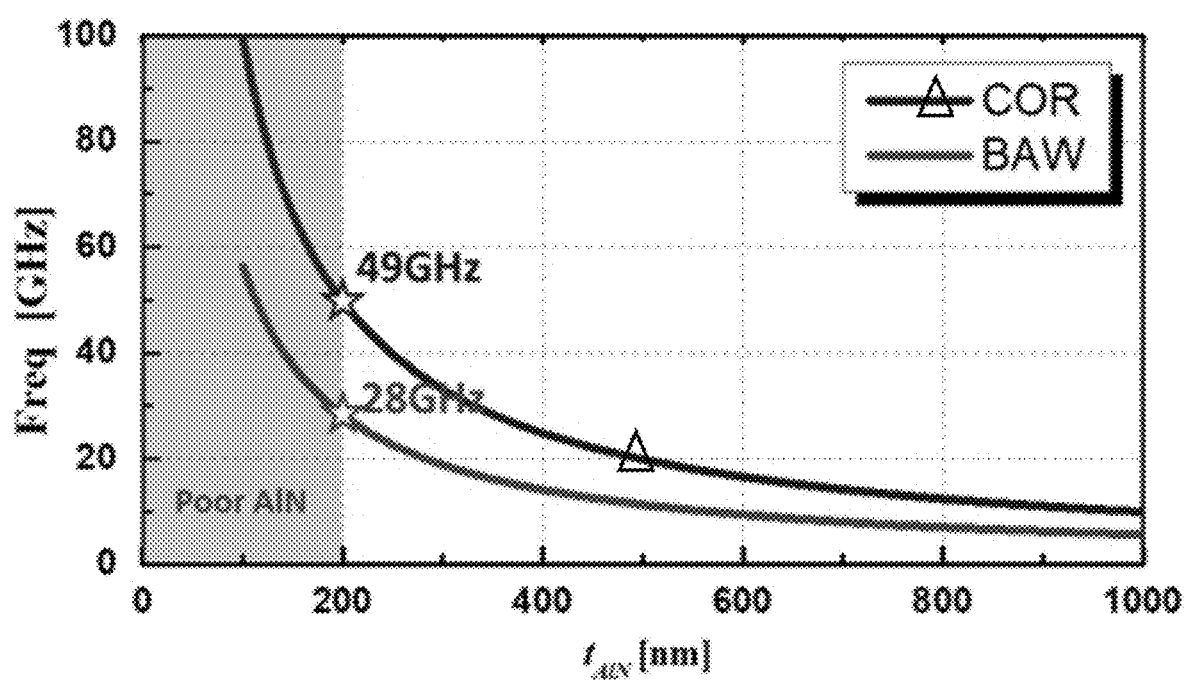
FIG. 10 illustrates operating frequencies versus AlN thickness for CORs and BAW resonators. The metal electrodes were not included in the FEM models used in the simulations.

The FEM simulated operating frequencies of a COR and a BAW resonator, for different thicknesses of the AlN film, $t_{AlN}$, are shown in FIG. 10. The operating frequency of the COR is 73% higher than the one of the BAW resonators. As evident, the COR technology can deliver resonators operating up to 49 GHz while maintaining an AlN thickness>200 nm (i.e. preserving good film quality of the piezoelectric film with <10% degradation compared to thicker films used in lower frequency devices) while the frequency of more conventional BAW resonators would be limited to 28 GHz under the same film thickness constraint.

Figure 11:
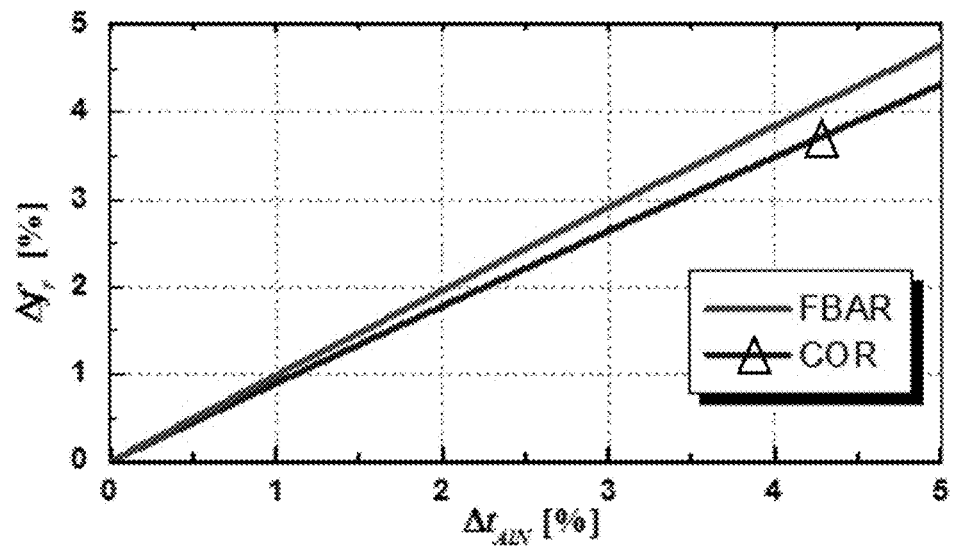
FIG. 11 illustrates simulated relative frequency shift $\Delta f_r$ for different relative variations of the resonator thickness, $\Delta t_{AlN}$. Electrodes are not included in the simulations for a fair comparison.

Another challenge associated with aggressive scaling of the film thickness is the highly increased sensitivity of the device operating frequency to process-related film thickness variations. This challenge is partially mitigated in CORs thanks to the transduction of a 2D mode of vibration with both lateral and vertical displacement components. As evident from the FEM simulation results in FIG. 11, CORs show a lower frequency sensitivity to thickness variation compared to more conventional BAW devices.

Figure 12:
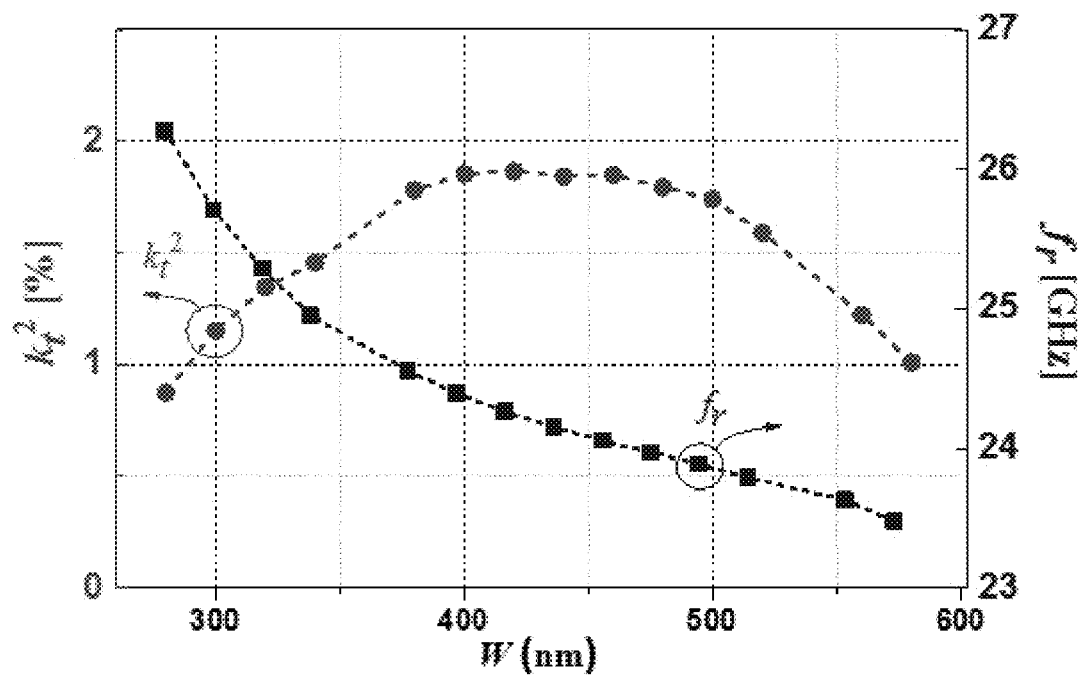
FIG. 12 illustrates simulated resonant frequency and $k_t^2$-values for different W-values for CORs using TFE-2 configuration around 24 GHz. The data points on W=360 nm and 540 nm are missing due to spurious modes.
Figure 13:
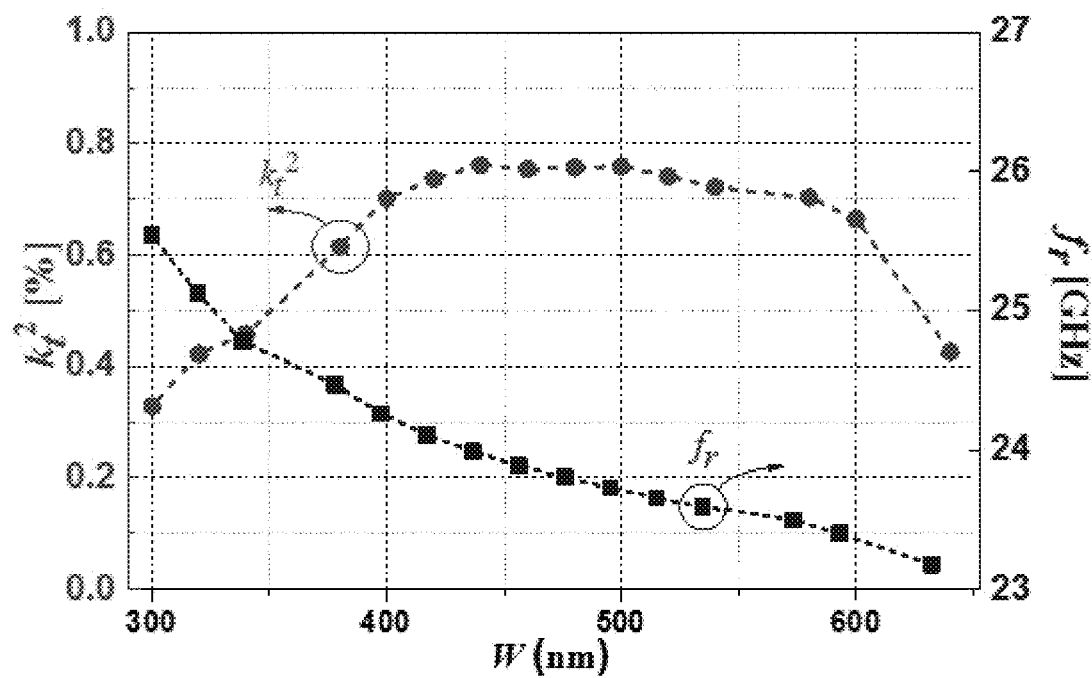
FIG. 13 illustrates simulated resonant frequency and $k_t^2$-values for different W-values for CORs using LFE configuration around 24 GHz. The data points on W=360 nm and 560 nm are missing due to spurious modes.

The special 2-D modal characteristics of CORs also enable lithographic control of the device resonance frequency which is not possible in more conventional BAW resonators relying on a thickness extensional mode of vibration. In particular, the FEM simulations herein show that a lithographic frequency tuning of ~4%, with <20% reduction in $k_t^2$, is possible for both TFE-2 and LFE CORs operating at ~24 GHz (FIG. 12-13).

The capability of lithographical tuning of the operating frequency of CORs offers advantages for the implementation of filter architectures. In fact, the synthesis of a micro-acoustic filter requires the coupling (electrically or mechanically) of multiple resonators operating at different frequencies. The COR technology is capable of delivering such multi-frequency resonators on the same chip with reduced fabrication complexity compared to more conventional resonator technologies for which lithographic frequency tuning is not possible requiring additional process steps (i.e. additional lithography masks and selective material deposition) to adjust the frequencies of individual resonators used to synthesize the filter. The bandwidth (BW) of a micro-acoustic ladder filter is directly proportional to the $k_t^2$-values of the resonators employed to synthesize the filter, while the filter Insertion Loss (I.L.) is inversely proportional to the product of the resonators $k_t^2$ and Q, as shown in (12-13).

$$BW \propto \frac{3}{\pi^2} k_t^2 \quad (12)$$

$$I.L. \propto \frac{1}{k_t^2 Q} \quad (13)$$

As discussed herein, AlN CORs provide $k_t^2$-values as high as 0.8%, for the LFE configuration, and 1.9% for the TFE-2 configuration, which directly translate into the capability of synthesizing mmWave filters with 100s MHz bandwidth, as reported in Table III and Table IV.

TABLE III

BANDWIDTH (BW) ACHIEVABLE BY $3^{RD}$ ORDER TFE-2 COR LADDER FILTERS IN THE MMWAVE SPECTRUM

| Freq [GHz] | BW [MHz] |
|---|---|
| 24 | 355 |
| 25 | 370 |
| 26 | 385 |
| 27 | 399 |
| 28 | 414 |
| 29 | 429 |
| 30 | 444 |
| 31 | 459 |
| 32 | 473 |
| 33 | 488 |
| 34 | 503 |
| 35 | 518 |
| 36 | 533 |

TABLE III-continued

BANDWIDTH (BW) ACHIEVABLE BY $3^{RD}$ ORDER TFE-2 COR LADDER FILTERS IN THE MMWAVE SPECTRUM

| Freq [GHz] | BW [MHz] |
|---|---|
| 37 | 547 |
| 38 | 562 |
| 39 | 577 |
| 40 | 592 |

TABLE IV

BANDWIDTH (BW) ACHIEVABLE BY $3^{RD}$ ORDER LFE COR LADDER FILTERS IN THE MMWAVE SPECTRUM

| Freq [GHz] | BW [MHz] |
|---|---|
| 24 | 150 |
| 25 | 156 |
| 26 | 163 |
| 27 | 169 |
| 28 | 175 |
| 29 | 181 |
| 30 | 188 |
| 31 | 194 |
| 32 | 200 |
| 33 | 206 |
| 34 | 213 |
| 35 | 219 |
| 36 | 225 |
| 37 | 231 |
| 38 | 238 |
| 39 | 244 |
| 40 | 250 |

Figure 14:
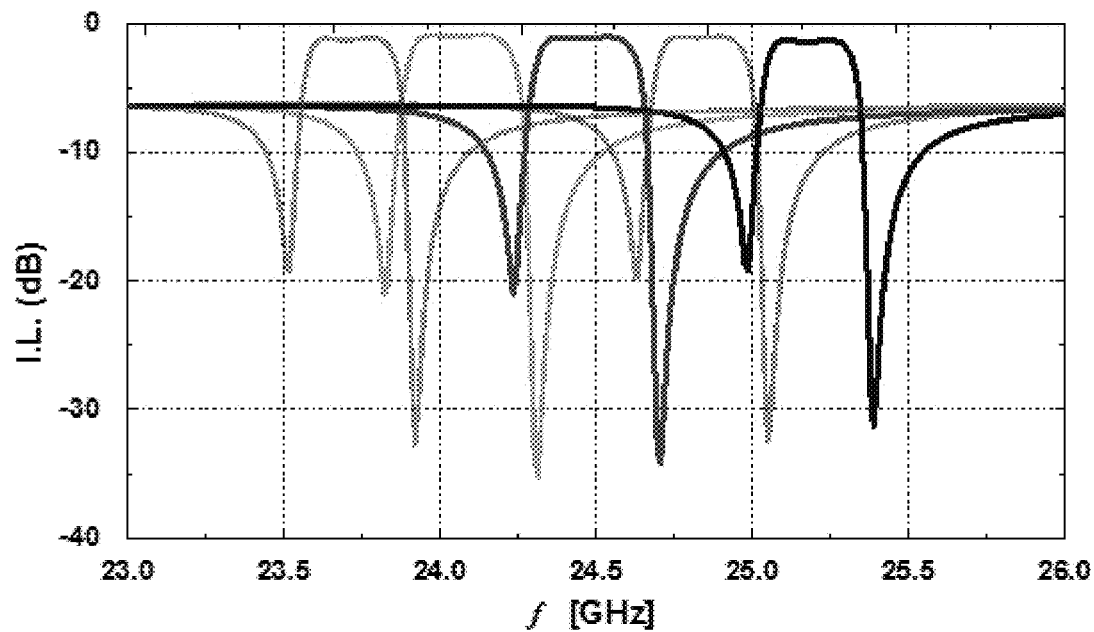
FIG. 14 illustrates FEM simulated performance of 5 contiguous ladder filters synthesized using lithographically defined multi-frequency TFE-2 CORs operating at ~24 GHz. Each filter has a BW>300 MHz covering an aggregated BW>1.6 GHz.
Figure 15:
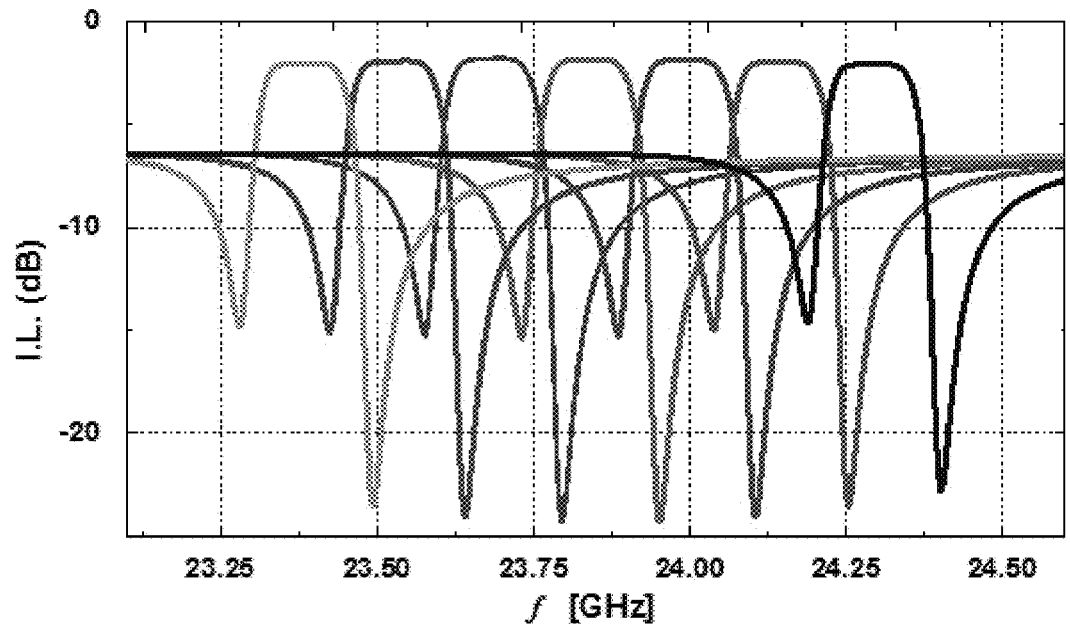
FIG. 15 illustrates FEM simulated performance of 7 contiguous ladder filters synthesized using lithographically defined multi-frequency LFE CORs operating at ~24 GHz. Each filter has a BW>150 MHz covering an aggregated BW>1 GHz.
Figure 16:
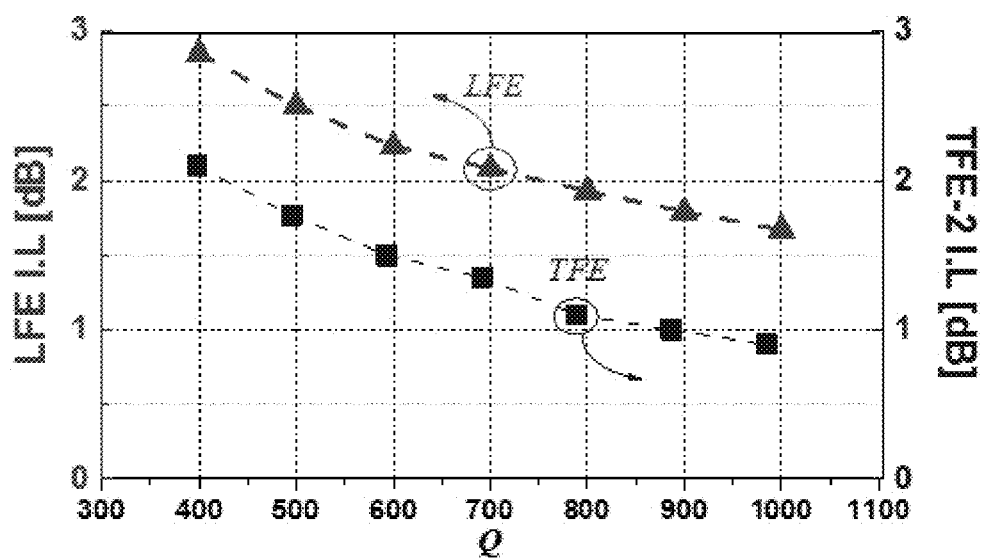
FIG. 16 illustrates simulated insertion loss (I.L.) for $3^{rd}$ order ladder filers made by LFE (red triangles) and TFE-2 (blue squares) CORs for different Q.

The performance level achievable by mmWave COR filters is here investigated by FEM simulations of contiguous $3^{rd}$ order ladder filters synthesized by lithographically defined TFE-2 (FIG. 14) and LFE (FIG. 15) CORs operating at ~24 GHz. The simulation results show that 5 lithographically defined multi-frequency TFE-2 COR filters achieve an individual filter BW>300 MHz capable of supporting an aggregated BW>1.6 GHz. Similarly, 7 lithographically defined multi-frequency LFE COR filters achieve an individual filter BW>150 MHz capable of supporting an aggregated BW>1 GHz. It is also worth noting that, assuming a resonator $Q_l$ of 750, an I.L.<1.2 dB is achieved with the TFE-2 configuration and an I.L.<2.0 is achieved with the LFE configuration. Even with a degraded Q of 500, an I.L.<1.5 dB is achieved for the TFE-2 configuration and an I.L.<2.5 is achieved with the LFE configuration, as shown in FIG. 16.

Note that this simulated performance level of the mmWave AlN LFE CORs is suitable for the synthesis of miniaturized and low-cost (simple 2-mask fabrication process) filters meeting the frequency, loss, bandwidth, roll-off and out-of-band rejection requirements of the 24 GHz 5G bands that have been recently licensed.

IV. Fabrication and Experimental Results

Figure 6:
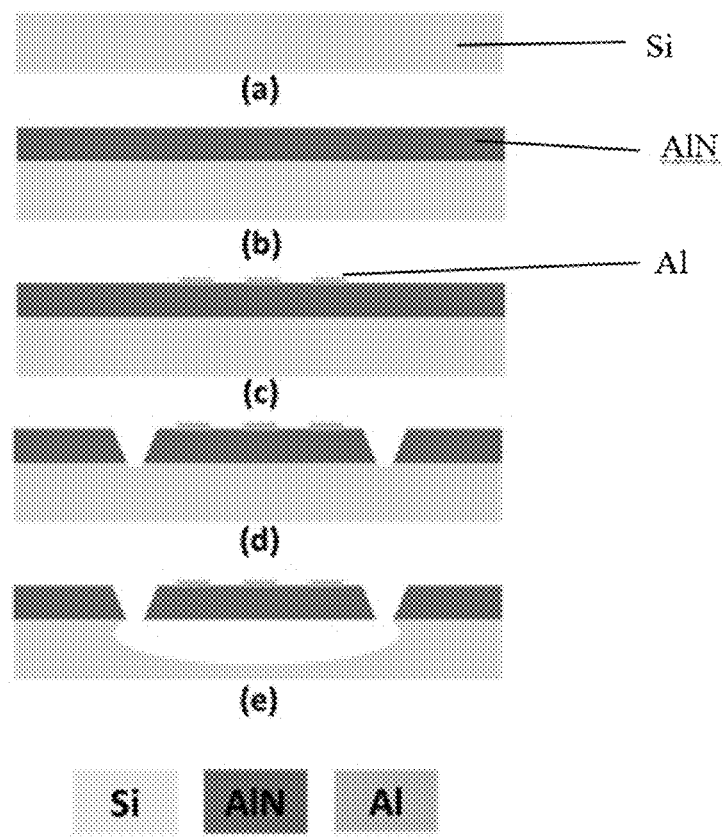
FIG. 6 illustrates a microfabrication process for LFE CORs.
Figure 7:
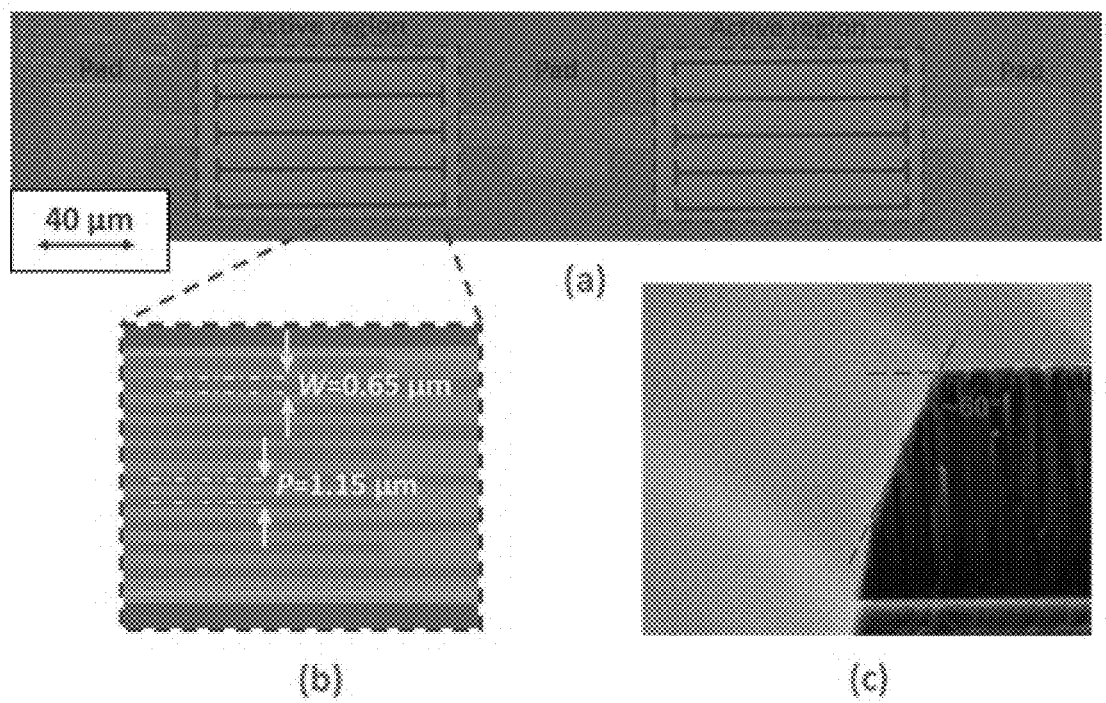
FIG. 7 illustrates SEM image of (a) CORs, (b) zoom-in of COR IDT, and (c) etching sidewall of COR. The device comprises an array of 8 resonators to obtain a high static capacitance value for matching 50Ω termination.

As a technological proof-of-concept LFE CORs were designed, fabricated and tested. Although the LFE configuration yields a lower $k_t^2$ than the TFE-2 one, it is characterized by the minimal fabrication complexity. The devices were fabricated using a simple 2-mask fabrication process as described in FIG. 6. The process started with the sputter deposition of a highly textured (1.1° FWHM) 1 μm thick AlN film directly on top of a polished high-resistivity silicon wafer. Then an aluminum (Al) layer was sputter deposited and patterned (using an i-line stepper) on top of the AlN to form the device top IDT electrode with a pitch of 1.15 μm. The AlN film was then dry etched in inductively coupled plasma (ICP) to define the shape of the suspended AlN plate. Finally, the devices were released from the substrate by $XeF_2$ dry isotropic etching of silicon. A scanned electron microscope (SEM) picture of a fabricated COR is shown in FIG. 7. As evident in FIG. 7(c), a sloped sidewall (SW) angle around 60° was observed in the cross-sectional view due to the photoresist etching mask employed in the process.

Figure 8A:
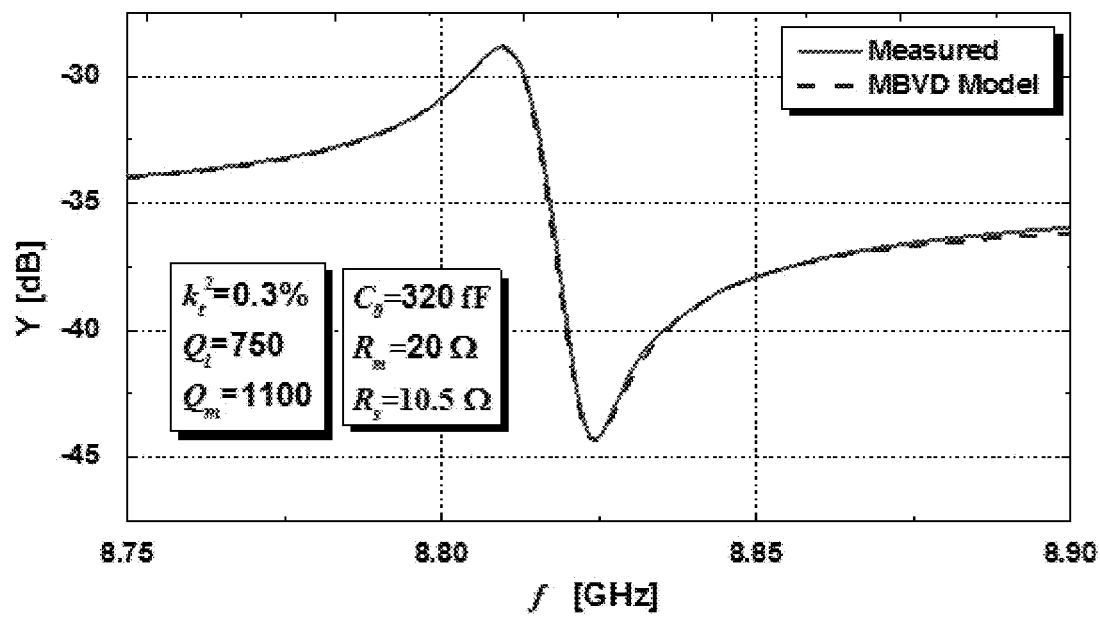
FIGS. 8A and 8B illustrate (FIG. 8A) measured and (FIG. 8B) FEM-simulated admittances of the sub-optimal COR design experimentally demonstrated: $t_{AlN}$=1 µm, $t_{Al}$=85 nm, W=1.15 µm, α=57%, SW angle=60°.
Figure 8B:
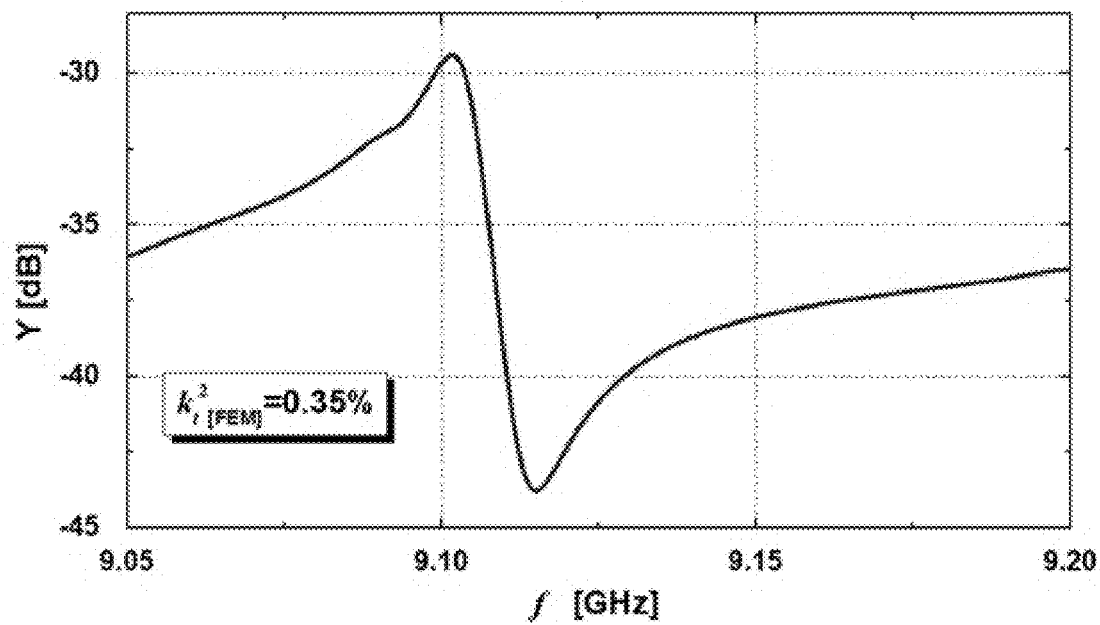

The performance of the fabricated prototypes were characterized using a Microwave Network Analyzer (Keysight N5221A PNA) in air and at room temperature. The measured admittance is shown in FIG. 8A. A strong resonance, corresponding to the transduction of the combined overtone mode of vibration, was measured near the frequency predicted by the FEM simulations with an error of 3%. The measured COR showed a loaded quality factor $Q_l$ of ~750 and a mechanical quality factor $Q_m$ of ~1100 (corresponding to $f \cdot Q_m \sim 1 \times 10^{13}$). Such Q-values are the highest ever reported for piezoelectric micro-acoustic resonators operating >6 GHz. In addition, the measured $f \cdot Q_m$ product $\sim 1 \times 10^{13}$ is the highest ever demonstrated for piezoelectric micro-acoustic resonators made out of a single AlN thin film employing a metal coverage of at least 50%, rivaling polycrystalline silicon capacitive resonators while exhibiting several orders of magnitude lower motional impedance.

Figure 9:
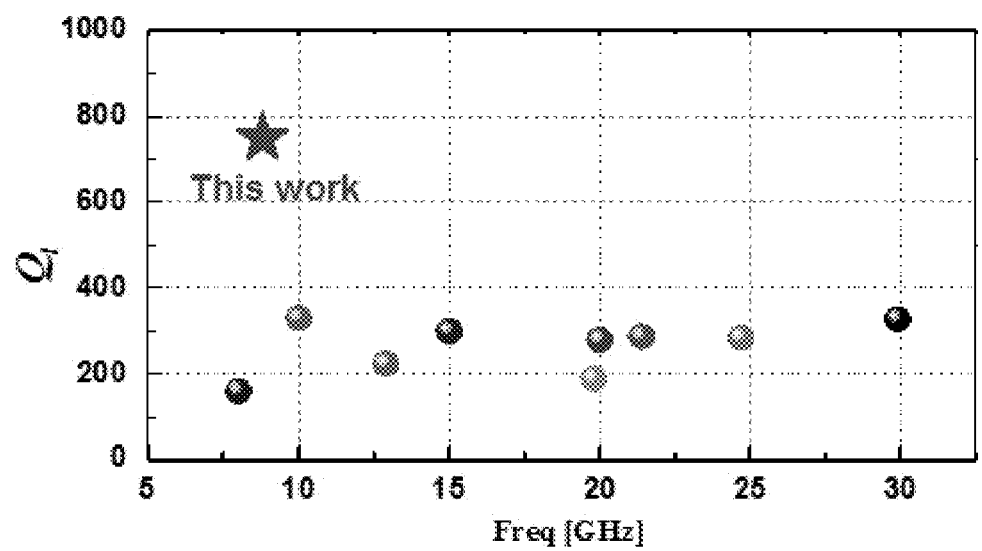
FIG. 9 illustrates a summary of $Q_f$-values for various piezoelectric resonator technologies past 6 GHz, where the star indicates the present technology. (M. Hara et al., "Super-High-Frequency Band Filters Configured with Air-Gap-Type Thin-Film Bulk Acoustic Resonators," *Jpn. J Appl. Phys.*, vol. 49, no. 7, p. 07HD13, July 2010. Y. Yoshino, "Piezoelectric thin films and their applications for electronics," *J. Appl. Phys.*, vol. 105, no. 6, p. 061623, March 2009. Y. Yang, R. Lu, T. Manzaneque, and S. Gong, "Toward Ka Band Acoustics: Lithium Niobate Asymmetrical Mode Piezoelectric MEMS Resonators," in 2018 *IEEE International Frequency Control Symposium (IFCS)*, Olympic Valley, C A, 2018, pp. 1-5. T. Yokoyama, M. Hara, M. Ueda, and Y. Satoh, "K-band ladder filters employing air-gap type thin film bulk acoustic resonators," in 2008 *IEEE Ultrasonics Symposium*, Beijing, China, 2008, pp. 598-601. E. Iborra, M. Clement, J. Capilla, J. Olivares, and V. Felmetsger, "Optimization of thin AlN sputtered films for X-band BAW resonators," in 2010 *IEEE International Ultrasonics Symposium*, San Diego, Calif., USA, 2010, pp. 1688-1691. G. Chen and M. Rinaldi, "High-Q X Band Aluminum Nitride Combined Overtone Resonators," in 2019 *Joint Conference of the IEEE International Frequency Control Symposium &European Frequency and Time Forum (IFCS-EFTF 2019)*, Orlando, Fla., 2019.)

A summary of $Q_l$-values reported in literature for piezoelectric resonators operating above 6 GHz is shown in FIG. 9. It is interesting to note that all demonstrated $Q_l$-values are nearly constant and below 400 in the 6-30 GHz range, even though AlN devices are supposed to show an increased $f$-$Q_{intrinsic}$ product in this frequency range. This trend demonstrates how the increased loss associated with aggressive scaling of the piezoelectric film and the electrodes in conventional resonators poses a hard limit to the maximum achievable $Q_l$-values. The COR technology described herein overcomes this fundamental limitation by exploiting the efficient transduction of a combined overtone mode of vibration in a relatively thick material stack, which directly translates into an improvement (>125%) in Q factor compared to the prior art piezoelectric resonator technologies.

An electromechanical-coupling coefficient, $k_t^2 \sim 0.3\%$ was also extracted from the measured electrical response of the devices. Note that this experimental value is lower than the highest one predicted by FEM simulation for the optimal design ($t_{AlN}$=1 μm, $t_{Al}$=120 nm, W=1.15 μm, α=35%, SW angle=90°, $k_t^2 \sim 0.78\%$). This is due to the fact that only a sub-optimal design ($t_{AlN}$=1 μm, $t_{Al}$=85 nm, W=1.15 μm, α=57%, SW angle=60°, $k_t^2 \sim 0.35\%$) could be experimentally demonstrated because of the limited fabrication capabilities available. State-of-the-art lithographic techniques in the integrated circuit (IC) industry would be sufficient to implement IDTs with pitches (W) and metallic coverage (α) suitable for optimal operation in the mm-Wave range (see Tables I and II). Furthermore, the use of a $SiO_2$ hard mask for the AlN etch would be sufficient to improve the SW angle to >80°. Nevertheless, the FEM simulation of the sub-optimal design (actual fabricated dimensions) matches well with the experimental results (FEM-simulated $k_t^2 \sim 0.35\%$), proving the validity of FEM model. Note also demonstrated COR prototypes were properly sized to have a static capacitance, $C_0 \sim 320$ fF which corresponds to a termination impedance of 56Ω at the device operating frequency, making the devices suitable for direct interface with 50Ω radio frequency systems without using off-chip impedance matching networks.

Figure 17:
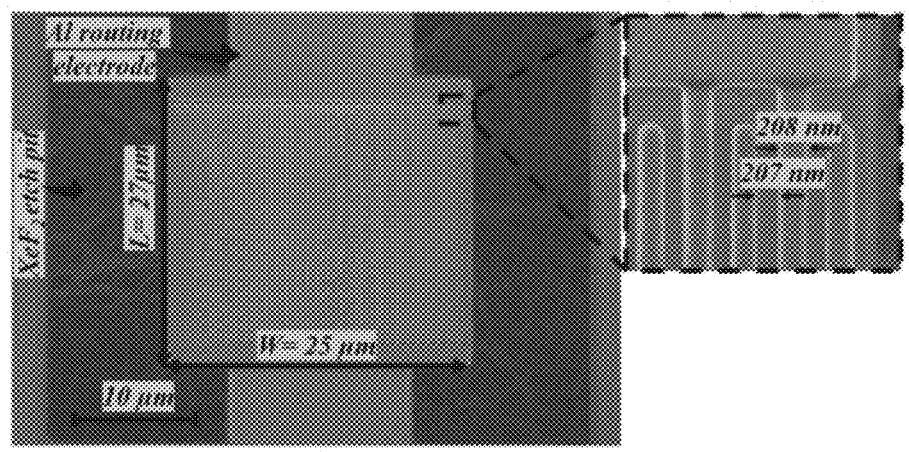
FIG. 17 illustrates SEM image of a fabricated 23.2 GHz COR.
Figure 18:
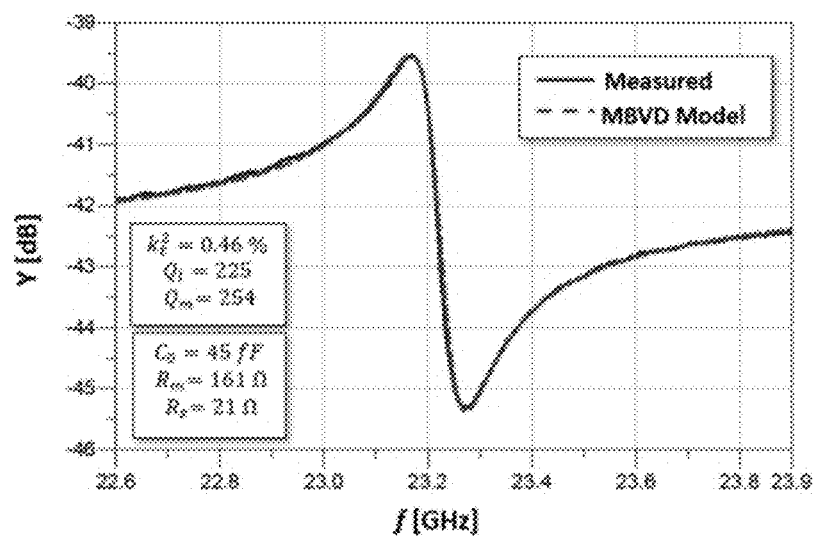
FIG. 18 is a graph of measured admittance for the COR of FIG. 17.

Additionally, a 23.2 GHz COR was fabricated using similar fabrication steps as previously described, except for employing electron beam lithography tool for patterning of the top electrode. A scanned electron micrograph of a fabricated 23.2 GHz COR is shown in FIG. 17. The 23.2 GHz COR was designed to have following design specifications: $t_{AlN}$=360 nm, $t_{Al}$=43 nm, W=414 nm, α=50%. Device performance was characterized using a Microwave Network Analyzer (KT-N5224A-200/W7X PNA) in air and at room temperature. The measured admittance is shown in FIG. 18. Resonance was observed near the frequency predicted by the FEA with an error of 7.5%. Measured mm wave COR showed a loaded quality factor, $Q_l$, of ~225 and a mechanical quality factor, $Q_m$ of ~254 (corresponding to $f \cdot Q_m \sim 0.6 \times 10^{13}$). Demonstrated Q-values are expected to improve with an optimized anchor design and improved fabrication process. An improved electromechanical-coupling coefficient of 0.46% was demonstrated, however, is still lower than the one predicted from the FEA model (0.73%). This discrepancy is attributed to sub-optimal design parameters ($t_{AlN}$=383 nm, $t_{Al}$=40 nm, W=415 nm, SW angle=70°) and can be mitigated with an unoptimized fabrication process.

V. Conclusions

The technology described herein provides a class of AlN MEMS resonators, called combined overtone resonators (CORs), that use the coherent combination of the $e_{33}$ and the $e_{15}$ piezoelectric coefficients of AlN for the multimodal excitation of the $2^{nd}$ and $3^{rd}$ order asymmetrical Lamb-wave overtones (A2 and A3 respectively) resulting in the efficient transduction of a 2-dimensional (2D) combined overtone mode (COM) of vibration in the cross-section of a suspended thin-film AlN plate. A COR prototype operating at ~9 GHz was fabricated and tested showing a high $k_t^2 \sim 0.3\%$ (using a simple top-electrode-only configuration with a 2-mask process) and a Q~1100, which is the highest ever achieved among piezoelectric resonators operating above 6 GHz. Detailed analytical and finite-element method (FEM) models were developed and used to demonstrate that a high electromechanical coupling coefficient, $k_t^2 \sim 1.9\%$, can be achieved by optimizing the device geometry and electrode configuration. The advantages of the COR technology for the implementation of a class of mmWave micro-acoustic filters is demonstrated by FEM analysis. $3^{rd}$ order ladder filters, using lithographically defined CORs operating at ~24 GHz, were designed and their performance simulated by FEM demonstrating the capability of synthesizing mmWave contiguous filters with 100s MHz bandwidths supporting aggregated bandwidths >1 GHz. The demonstrated performance level of the mmWave AlN CORs is suitable for the synthesis of miniaturized, single-chip and low-cost contiguous filters meeting the frequency, loss, bandwidth, roll-off and out-of-band rejection requirements of 24 GHz 5G bands. Therefore, the COR technology described herein addresses the challenges that have so far prevented the implementation of high performance mmWave micro-acoustic filters for ubiquitous and pervasive mobile internet connectivity enabled by highly miniaturization and integrated 5G systems.

As used herein, "consisting essentially of" allows the inclusion of materials or steps that do not materially affect the basic and novel characteristics of the claim. Any recitation herein of the term "comprising," particularly in a description of components of a composition or in a description of elements of a device, can be exchanged with "consisting essentially of" or "consisting of."

The present technology has been described in conjunction with certain preferred embodiments and aspects. It is to be understood that the technology is not limited to the exact details of construction, operation, exact materials or embodiments or aspects shown and described, and that various modifications, substitution of equivalents, alterations to the compositions, and other changes to the embodiments and aspects disclosed herein will be apparent to one of skill in the art.

What is claimed is:

1. A resonator system comprising:
    a combined overtone resonator device comprising:
        a piezoelectric plate suspended from a substrate, the piezoelectric plate having a top surface, a bottom surface, a length direction, a width direction and a thickness direction between the top surface and the bottom surface, the top surface and the bottom surface extending along the length direction and the width direction, and
        a first interdigitated electrode comprising a plurality of conductive strips disposed on one of the top surface or the bottom surface of the piezoelectric plate, wherein each of the plurality of conductive strips has an electrode width substantially along the width direction, and wherein the plurality of conductive strips are arranged with a pitch substantially along the width direction; and
    circuitry in communication with the combined overtone resonator device to apply an alternating voltage through the first interdigitated electrode to excite a two-dimensional mode of mechanical vibration in a cross sectional plane of the piezoelectric plate, the cross sectional plane extending along the width direction and the thickness direction, the two-dimensional mode of mechanical vibration comprising a two-dimensional combined overtone mode of second and third order asymmetrical Lamb-wave overtones.

2. The system of claim 1, further comprising a second interdigitated electrode including a plurality of conductive strips disposed on another of the top surface or the bottom surface of the piezoelectric plate, wherein adjacent ones of the conductive strips on the top surface have opposite polarities, and ones of the conductive strips on the bottom surface have a same polarity as a most closely overlying one of the conductive strips on the top surface; and
    the circuitry is in communication with the combined overtone resonator device to apply the alternating voltage through the first interdigitated electrode and the second interdigitated electrode to excite the two-dimensional mode of mechanical vibration in the cross sectional plane.

3. The system of claim 1, further comprising a second plate electrode disposed on another of the top surface or the bottom surface of the piezoelectric plate.

4. The system of claim 1, wherein the pitch of the first interdigitated electrode is equal to the thickness of the piezoelectric plate.

5. The system of claim 1, wherein the pitch of the first interdigitated electrode is within 50% of the thickness of the piezoelectric plate.

6. The system of claim 1, wherein the electrode width of each conductive strip is in a range of 10 nm to 10 μm.

7. The system of claim 1, wherein the thickness of the piezoelectric plate is in a range of 100 nm to 100 μm.

8. The system of claim 1, wherein the piezoelectric plate is selected from aluminum nitride, lithium niobate, lithium tantalite, zinc oxide, gallium nitride, scandium nitride, aluminum scandium nitride, and quartz, and combinations thereof.

9. The system of claim 1, wherein the first interdigitated electrode is selected from aluminum, ruthenium, molybdenum, and tungsten and combinations thereof.

10. The system of claim 1, wherein a frequency of the two-dimensional combined overtone mode is in a range of 1 MHz to 100 GHz.

11. The system of claim 1, wherein the combined overtone resonator device has an electro-mechanical coupling efficiency of 0.1% to 10.0%.

12. The system of claim 1, wherein the combined overtone resonator device has a quality factor of at least 200 at a frequency of 6 GHz or greater.

13. The system of claim 1, wherein the combined overtone resonator device is operative in a frequency range of 6 GHz to 40 GHz.

14. The system of claim 1, wherein the circuitry comprises filter circuitry, circulator circuitry, or oscillator circuitry.

15. A filter comprising a plurality of combined overtone resonator devices of claim 1, the plurality of combined overtone resonator devices formed on the substrate, each device tuned to a different frequency bandwidth.

16. A filter comprising:
    a plurality of combined overtone resonator devices, the plurality of combined overtone resonator devices formed on a single substrate, each device tuned to a different frequency bandwidth, each device comprising:
        a piezoelectric plate suspended from a substrate, the piezoelectric plate having a top surface, a bottom surface, a length direction, a width direction and a thickness direction between the top surface and the bottom surface, the top surface and the bottom surface extending along the length direction and the width direction, and
        a first interdigitated electrode comprising a plurality of conductive strips disposed on one of the top surface or the bottom surface of the piezoelectric plate, wherein each of the plurality of conductive strips has an electrode width substantially along the width direction, and wherein the plurality of conductive strips are arranged with a pitch substantially along the width direction; and
    circuitry in communication with each of the combined overtone resonator devices to apply an alternating voltage through the first interdigitated electrode to excite a two-dimensional mode of mechanical vibration in a cross sectional plane of the piezoelectric plate, the cross sectional plane extending along the width direction and the thickness direction, the two-dimensional mode of mechanical vibration comprising a two-dimensional combined overtone mode of second and third order asymmetrical Lamb-wave overtones.

17. The filter of claim 16, wherein the pitch of the first interdigitated electrode of each device is different from the pitch of the first interdigitated electrodes of others of the plurality of devices.

18. The filter of claim 16, wherein the frequency bandwidth of each device ranges from 300 to 600 MHz.

19. A combined overtone resonator device comprising:
- a piezoelectric plate suspended from a substrate, the piezoelectric plate having a top surface, a bottom surface, a length direction, a width direction, and a thickness direction between the top surface and the bottom surface, the top surface and the bottom surface extending along the length direction and the width direction; and
- a first interdigitated electrode comprising a plurality of conductive strips disposed on the top surface of the piezoelectric plate, a second interdigitated electrode comprising a plurality of conductive strips disposed on the bottom surface of the piezoelectric plate, wherein each of the conductive strips has an electrode width substantially along the width direction, and wherein the plurality of conductive strips are arranged with a pitch substantially along the width direction;
- adjacent ones of the conductive strips on the top surface have opposite polarities, and each of the conductive strips on the bottom surface has a same polarity as a most closely overlying one of the conductive strips on the top surface; and
- wherein a two-dimensional mode of mechanical vibration is excited in a cross sectional plane of the piezoelectric plate in response to an alternating voltage applied through the interdigitated electrode and the second interdigitated electrode, the cross sectional plane extending along the width direction and the thickness direction, the two-dimensional mode of mechanical vibration comprising a two-dimensional combined overtone mode of second and third order asymmetrical Lamb-wave overtones.

20. A filter comprising a plurality of combined overtone resonator devices of claim 19, the devices formed on the substrate, each device tuned to a different frequency bandwidth.

* * * * *